(12) United States Patent
Garrity et al.

(10) Patent No.: US 7,649,957 B2
(45) Date of Patent: Jan. 19, 2010

(54) NON-OVERLAPPING MULTI-STAGE CLOCK GENERATOR SYSTEM

(75) Inventors: Douglas A. Garrity, Gilbert, AZ (US); Mohammad Nizam Kabir, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 670 days.

(21) Appl. No.: 11/387,466

(22) Filed: Mar. 22, 2006

(65) Prior Publication Data

US 2007/0223633 A1  Sep. 27, 2007

(51) Int. Cl.
*H04L 27/10* (2006.01)
(52) U.S. Cl. .................. 375/280; 326/97; 327/259
(58) Field of Classification Search ................ 375/280, 375/354; 326/28, 97; 714/729; 327/172, 327/259
See application file for complete search history.

(56) References Cited

U.S. PATENT DOCUMENTS

| | | | |
|---|---|---|---|
| 4,404,525 A | 9/1983 | Amir et al. | |
| 4,438,354 A | 3/1984 | Haque | |
| 4,441,082 A | 4/1984 | Haque | |
| 4,555,668 A | 11/1985 | Gregorian et al. | |
| 5,306,962 A | 4/1994 | Lamb | |
| 5,363,102 A | 11/1994 | Ferguson, Jr. | |
| 5,453,707 A * | 9/1995 | Hiratsuka et al. | 326/97 |
| 5,525,920 A | 6/1996 | Rakers et al. | |
| 5,572,154 A | 11/1996 | Rakers et al. | |
| 5,574,457 A | 11/1996 | Garrity et al. | |
| 5,625,360 A | 4/1997 | Garrity et al. | |
| 5,625,361 A | 4/1997 | Garrity et al. | |
| 5,644,313 A | 7/1997 | Rakers et al. | |
| 5,684,484 A | 11/1997 | Suzuki | |
| 5,818,276 A | 10/1998 | Garrity | |
| 5,894,284 A | 4/1999 | Garrity et al. | |
| 5,998,978 A | 12/1999 | Connell et al. | |
| 6,011,433 A | 1/2000 | Nairn | |
| 6,134,130 A | 10/2000 | Connell et al. | |
| 6,317,755 B1 | 11/2001 | Rakers et al. | |
| 6,362,770 B1 | 3/2002 | Miller et al. | |
| 6,384,727 B1 | 5/2002 | Diprizio et al. | |
| 6,392,544 B1 | 5/2002 | Collins et al. | |
| 6,397,174 B1 | 5/2002 | Poznanski et al. | |
| 6,400,301 B1 | 6/2002 | Kullalli et al. | |
| 6,452,518 B1 | 9/2002 | Kawabata | |
| 6,466,126 B2 | 10/2002 | Collins et al. | |
| 6,535,157 B1 | 3/2003 | Garrity et al. | |
| 6,538,588 B1 | 3/2003 | Bazarjani | |
| 6,549,085 B1 | 4/2003 | Wagh et al. | |
| 6,587,010 B2 | 7/2003 | Wagh et al. | |
| 6,594,217 B1 | 7/2003 | Reed | |
| 6,614,323 B2 | 9/2003 | Wagh et al. | |

(Continued)

*Primary Examiner*—David C Payne
*Assistant Examiner*—Leon-Viet Q Nguyen
(74) *Attorney, Agent, or Firm*—Ingrassia, Fisher & Lorenz, P.C.

(57) ABSTRACT

A multi-stage non-overlapping clock signal generator as described herein is suitable for use with a pipelined analog-to-digital converter architecture. The clock signal generator generally includes a back end clock generator, a second stage clock generator, and a first stage clock generator coupled in series. The clock signal generator may also include any number of intermediate stage clock generators coupled in series between the back end clock generator and the second stage clock generator. Example implementations of the various clock generator stages are also described herein.

18 Claims, 10 Drawing Sheets

U.S. PATENT DOCUMENTS

| | | |
|---|---|---|
| 6,614,856 B1 | 9/2003 | Meyer |
| 6,624,779 B2 | 9/2003 | Hochschild |
| 6,665,338 B1 | 12/2003 | Midya et al. |
| 6,693,572 B1 | 2/2004 | Oliaei et al. |
| 6,697,001 B1 | 2/2004 | Oliaei et al. |
| 6,756,929 B1 | 6/2004 | Ali |
| 6,763,996 B2 | 7/2004 | Rakers et al. |
| 6,784,821 B1 | 8/2004 | Lee |
| 6,784,824 B1 | 8/2004 | Quinn |
| 6,810,459 B1 | 10/2004 | Griffin et al. |
| 6,965,339 B2 | 11/2005 | Midya et al. |
| 6,967,611 B2 | 11/2005 | Atriss et al. |
| 7,023,372 B1 | 4/2006 | Singh et al. |
| 7,057,492 B2 | 6/2006 | Jackson et al. |
| 7,064,700 B1 | 6/2006 | Garrity et al. |
| 7,068,169 B2 | 6/2006 | Collins et al. |
| 7,177,616 B2 | 2/2007 | Connell et al. |
| 7,307,572 B2 | 12/2007 | Garrity et al. |
| 7,312,654 B2 | 12/2007 | Roeckner et al. |
| 7,495,515 B1 | 2/2009 | Branch et al. |
| 2001/0011361 A1* | 8/2001 | Park et al. .................... 714/729 |
| 2001/0050624 A1 | 12/2001 | Nagaraj |
| 2004/0203557 A1 | 10/2004 | Zhang |
| 2004/0222841 A1* | 11/2004 | Lin et al. .................... 327/536 |
| 2005/0053180 A1* | 3/2005 | Nose et al. .................... 375/354 |

* cited by examiner

NON-OVERLAPPING MULTI-STAGE CLOCK GENERATOR SYSTEM

TECHNICAL FIELD

The present invention relates generally to clock generator circuits. More particularly, the present invention relates to a non-overlapping clock generation circuit.

BACKGROUND

Clock generation circuits can be used to clock synchronous digital circuits and mixed-signal, such as analog-to-digital converters. A clock generation circuit provides one or more repetitive clock signals, each having a constant period. A typical clock signal has a first phase and a second phase within a single period of the clock signal. Typically, a clock generation circuit provides both an inverted clock signal and a non-inverted clock signal. In addition, a clock generation circuit may be designed to generate a delayed clock signal that is based upon another clock signal generated by the circuit.

Two clock signals can be timed such that they are non-overlapping with respect to each other. Two clock signals are non-overlapping if only one of the clock signals can be high (or low) at any given time. In other words, if two non-overlapping clock signals are viewed on the same time axis, the respective clock pulses will never overlap and will always be separated from each other. A simple non-overlapping clock generation circuit may provide a non-inverted clock signal and inverted clock signal that respectively transition (at the trailing end) before a delayed non-inverted clock signal and a delayed inverted clock signal.

Conventional non-overlapping clock generator circuits are well known in the art and are commonly used to generate the required non-overlapping clock signals for switched capacitor circuits. In general, non-overlapping clock signals are used to reduce voltage error in such switched capacitor circuits. However, as the signal frequencies to be processed and the associated clock frequencies increase, conventional non-overlapping clock generator circuits use an unacceptably large portion of the clock period to generate the non-overlapped clock signals and become the limiting factor in operating switched capacitor circuits at high clock frequencies.

A pipelined analog-to-digital converter is one practical application for a non-overlapping clock generator. A pipelined analog-to-digital converter typically utilizes multiple analog-to-digital stages coupled in series, where each stage may be driven by different derivative clock signals based upon a "primary" clock signal and its inverted or complementary clock signal. One conventional approach for the generation of these derivative clock signals relies on a single clock generator circuit that generates all of the clock signal variants. A single clock generator circuit, however, must be designed to meet the requirements of the quickest and most accurate stage while driving the load from all stages. Consequently, such a single clock generator circuit may be over-designed, excessively complex, and require an impractical amount of physical space and operating power. In addition, a single clock generator circuit may need to provide very large charging currents for short periods of time, and such currents can interact with the package and bond wire inductances (causing the power supply voltages to bounce in an undesirable manner).

Another conventional approach uses a "local" clock generator circuit for each stage in the pipelined analog-to-digital converter, where each clock generator circuit is optimized for the specific loading and timing requirements of the respective converter stage, thereby saving power and area relative to a single clock generator circuit implementation. However, in addition to the clock synchronization requirements for each individual stage, essentially the same stringent timing relationships between the clock phases of a stage and the stage that follows it in the pipeline are required in order to process an input signal correctly through each stage of the pipeline. Since "local" per-stage clock generators cannot be readily synchronized globally with respect to the other local clock generators throughout the pipeline, this approach does not adequately enable precision analog-to-digital converter performance.

Accordingly, it is desirable to have a non-overlapping clock generator that can provide a variety of clock signals having specific timing relationships relative to one another in an efficient and robust manner. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
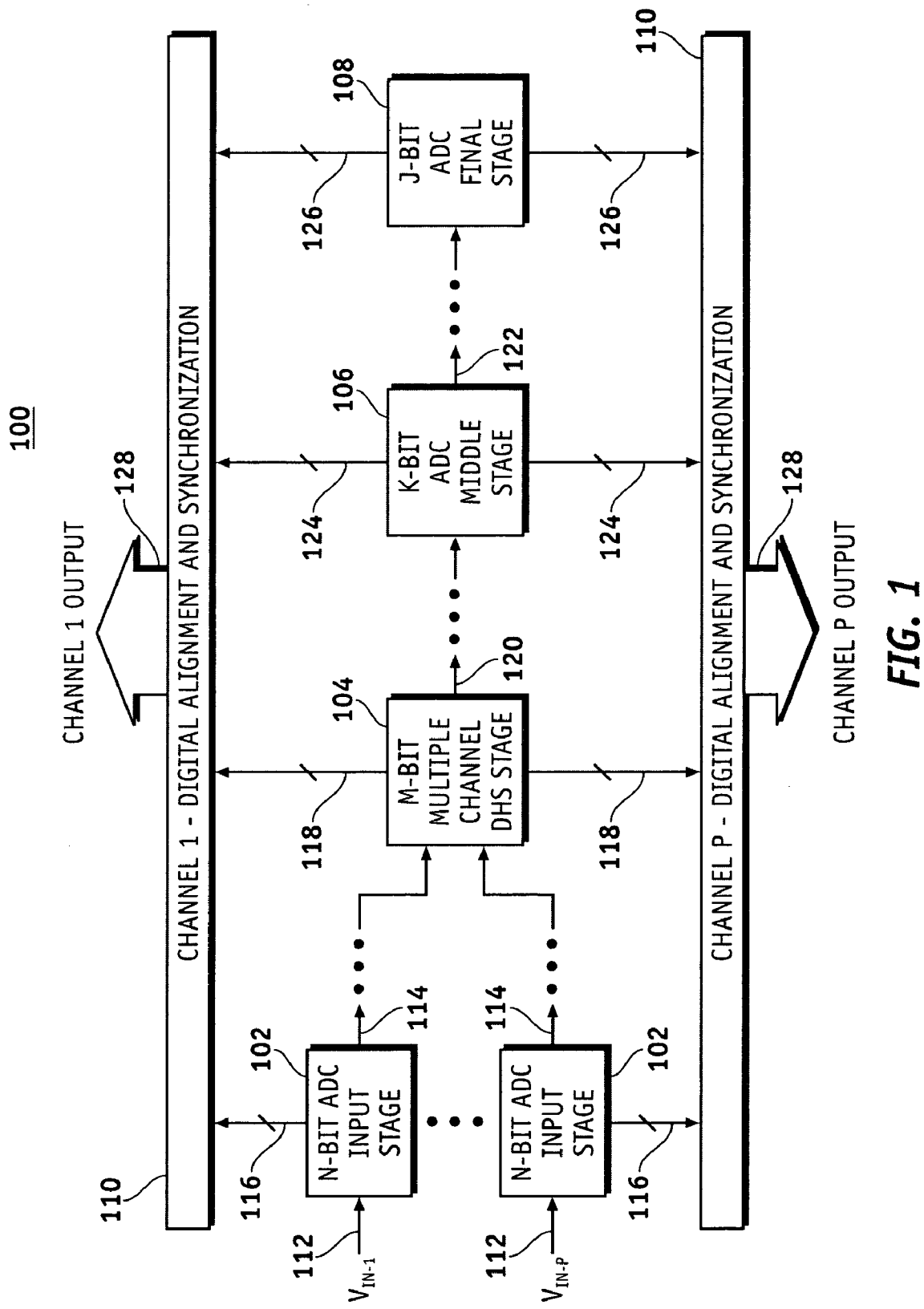
FIG. 1 is a schematic representation of a generalized pipelined analog-to-digital converter ("ADC") configured in accordance with an example embodiment of the invention.

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, clocks, digital logic elements, look-up tables, or the like, which may carry out a variety of functions under the control of one or more microprocessors or other control devices. In addition, those skilled in the art will appreciate that the present invention may be practiced in conjunction with any number of applications and that the ADC architectures described herein are merely example applications for embodiments of the clock generator architectures.

For the sake of brevity, conventional techniques related to switched capacitance gain stages, clock circuits, ADC architectures, digital logic circuits, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node/feature is directly or indirectly joined to (or is in direct or indirect communication with) another node/feature, and not necessarily physically. As used herein, unless expressly stated otherwise, "connected" means that one node/feature is directly joined to (or is in direct communication with) another node/feature. For example, a switch may be "coupled" to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

FIG. 1 is a schematic representation of a generalized pipelined multi-channel ADC 100 configured in accordance with an example embodiment of the invention. Clock generator architectures as described below can be utilized to generate a plurality of non-overlapping clock signals and clock phases for ADC 100. ADC 100 is described in detail in U.S. patent application Ser. No. 11/154,405, titled "Multi-Channel Analog to Digital Converter" (which is incorporated by reference herein). ADC 100 generally includes a plurality of separate input stages 102, a delay/holding and synchronization ("DHS") stage 104 coupled to input stages 102, at least one middle stage 106 coupled to DHS stage 104, and a final stage 108 coupled to the last middle stage 106. ADC 100 may also include an architecture or arrangement 110 configured to perform digital alignment, synchronization, and/or correction for the multiple channels supported by ADC 100. FIG. 1 depicts ADC 100 in a generalized manner that is intended to represent the flexible nature of ADC 100. In this regard, ADC 100 may include any number (including zero) of separate input stages 102 that accommodate input voltage signals from up to P different channels. When no input stages 102 are utilized, DHS stage 104 serves as a "combined" first stage for the multiple channels. In addition, a given channel may utilize more than one input stage 102 in series, as indicated by the ellipses following the output of input stages 102. In other words, a given channel may include any number of input stages coupled in series before DHS stage 104. Similarly, although FIG. 1 depicts one middle stage 106, any number of middle stages (including zero) can be utilized in a practical embodiment. Furthermore, final stage 108 is optional and need not be utilized in all practical embodiments. Indeed, a simple embodiment can be realized with input stages 102 and DHS stage 104 alone, without any middle stages 106 and without final stage 108.

ADC 100 and the various stages of ADC 100 need not process any specific number of bits, and the bit resolution of ADC 100 and the various stages of ADC 100 can be selected to suit the needs of the particular application. For example, an input stage 102 is suitably configured to process its respective analog input voltage signal and to generate an N-bit output corresponding to that input voltage signal. In practice, N can be any number (including zero if an input stage 102 is realized as a sample and hold stage rather than an ADC stage) and the actual number need not be the same for all input stages 102. Thus, the input stage 102 for one channel might generate two output bits per sample, while the input stage 102 for another channel might generate four output bits per sample. Similarly, the number of bits (1 through M) and number of channels that are processed by DHS stage 104 can be adjusted as needed for the given application, and the actual number of bits in the digital output for each channel need not be the same. Likewise, the number of bits (1 through K) and the number of channels that are processed by any middle stage 106 can be adjusted as needed for the given application, and the actual number of bits in the digital output for each channel need not be the same. Finally, the number of bits (1 through J) and the number of channels that are processed by final stage 108 can be adjusted as needed for the given application, and the actual number of bits in the digital output for each channel need not be the same. Notably, the variables N, M, K, and J mentioned above need not be correlated in any way.

ADC 100 is suitably configured such that a plurality of input voltage signals 112 are simultaneously sampled with distinct input stages 102. Thereafter, one of the samples is delayed by DHS stage 104, which processes both samples in an alternating manner. DHS stage 104 merges the input channels together, delays the sample streams from the input channels relative to one other, and (in some embodiments) processes the residual voltages from the input channels in sequential fashion. The use of input stages 102 reduces the accuracy requirements of DHS stage 104, which enables the practical use of DHS stage 104 in applications that require high precision. The use of separate input stages 102 also provides improved isolation between the multiple channels. Furthermore, DHS stage 104 is suitably configured to provide a balanced load to input stages 102, which is desirable to preserve signal integrity.

In a practical embodiment, input stages 102 are configured to concurrently sample a plurality of input voltage signals 112 every other clock phase, and to concurrently provide a plurality of voltage sample sequences 114, where the plurality of voltage sample sequences 114 are derived from the plurality of input voltage signals 112. If an input stage 102 is realized as a sample-and-hold stage, then the voltage sample sequence 114 will correspond to the sampled input voltage signal 112 and input stage 102 will not generate a digital output. If an input stage 102 is realized as an ADC stage (for example, a switched capacitor gain stage), then the voltage sample sequence 114 will typically include samples having voltage levels that are different than the voltage levels of the corresponding samples from input voltage signal 112. An ADC stage will also generate an N-bit digital output 116 for each channel in response to the respective input voltage signal. As depicted in FIG. 1, the digital outputs 116 are processed by architecture 110 for contribution to the multi-channel output data.

DHS stage 104 is coupled to the respective outputs of input stages 102 to receive voltage sample sequences 114 (or suitable sample sequences that are based upon or derived from voltage sample sequences 114). DHS stage 104 concurrently samples voltage sample sequences 114 to obtain a plurality of DHS voltage sample sequences. The DHS voltage sample sequences correspond to, or are derived from, the respective voltage sample sequences 114. In practical embodiments, the DHS voltage sample sequences are internally obtained and processed by DHS stage 104. As described in more detail below, DHS stage 104 is suitably configured to alternately process the DHS voltage sample sequences using a double sampling technique. In example embodiments, DHS stage 104 performs double sampled processing relative to input stages 102. DHS stage 104 is also configured to generate a plurality of M-bit digital outputs 118 corresponding to voltage sample sequences 114. As depicted in FIG. 1, the digital outputs 118 are processed by architecture 110 for contribution to the multi-channel output data.

DHS stage 104 is structured to provide a series or sequence of interleaved DHS voltage samples 120, where the interleaved DHS voltage samples 120 are derived from the DHS voltage sample sequences processed by DHS stage 104. Notably, DHS stage 104 staggers the DHS voltage sample sequences to generate a single output sequence. In example embodiments, DHS stage 104 alternates between two DHS voltage sample sequences to produce one double sampled output sequence, e.g., interleaved DHS voltage samples 120.

A middle stage 106 may be coupled to the respective output of DHS stage 104 to receive interleaved DHS voltage samples 120 (or a suitable sample sequence that is based upon or derived from interleaved DHS voltage samples 120). Middle stage 106 is suitably configured to sample the series of interleaved DHS voltage samples 120 on every clock phase. In a practical embodiment, middle stage 106 can employ conventional techniques and/or known double sampled switched capacitor gain stage architectures. For example, one suitable architecture is disclosed in U.S. Pat. No. 5,574,457 (this patent is incorporated by reference herein). Middle stage 106 also generates and provides a series of interleaved residual voltage samples 122 at its output. The series of interleaved residual voltage samples 122 correspond to, or are derived from, the series of interleaved DHS voltage samples 120, and the interleaved residual voltage samples are output on every clock phase. Middle stage 106 is also configured to generate a plurality of K-bit digital outputs 124 corresponding to the series of interleaved DHS voltage samples 120. Notably, the digital outputs 124 for the different channels are generated in an alternating fashion. As depicted in FIG. 1, the digital outputs 124 are processed by architecture 110 for contribution to the multi-channel output data.

As mentioned above, a practical embodiment of ADC 100 may employ any number of middle stages 106 coupled in series, where each middle stage 106 generates a series of interleaved residual voltage samples 122 for the next stage in ADC 100. In some embodiments, ADC 100 includes final stage 108 coupled to the output of a middle stage 106. In embodiments having no middle stages 106, ADC 100 may include final stage 108 coupled to the output of DHS stage 104. Actually, final stage 108 is optional and need not be employed in all practical embodiments. Assuming that middle stage 106 is present, final stage 108 is coupled to receive interleaved residual voltage samples 122 (or a suitable sample sequence that is based upon or derived from interleaved residual voltage samples 122). Final stage 108 is suitably configured to sample, process, and convert the series of interleaved residual voltage samples 122. In a practical embodiment, final stage 108 can employ conventional sampling, comparison, and flash analog-to-digital conversion techniques to convert the series of interleaved residual voltage samples 122 to digital format while concurrently generating any remaining output bits as necessary. In this regard, final stage 108 samples the series of interleaved residual voltage samples 122 and generates a plurality of J-bit digital outputs 126 corresponding to the series of interleaved residual voltage samples 122. Notably, the digital outputs 126 for the different channels are generated in an alternating fashion. As depicted in FIG. 1, the digital outputs 126 are processed by architecture 110 for contribution to the multi-channel output data.

Architecture 110 is designed to align and synchronize the various digital outputs from the pipeline stages to provide proper timing of the ultimate channel output data 128. In addition, architecture 110 may be configured to perform digital correction, bit consolidation, and/or other digital processing of the various digital outputs prior to generating the channel output data 128. In this regard, architecture 110 may leverage conventional digital correction logic employed by known ADC circuits. One suitable correction architecture is disclosed in U.S. Pat. No. 5,644,313 (this patent is incorporated by reference herein).

Figure 2:
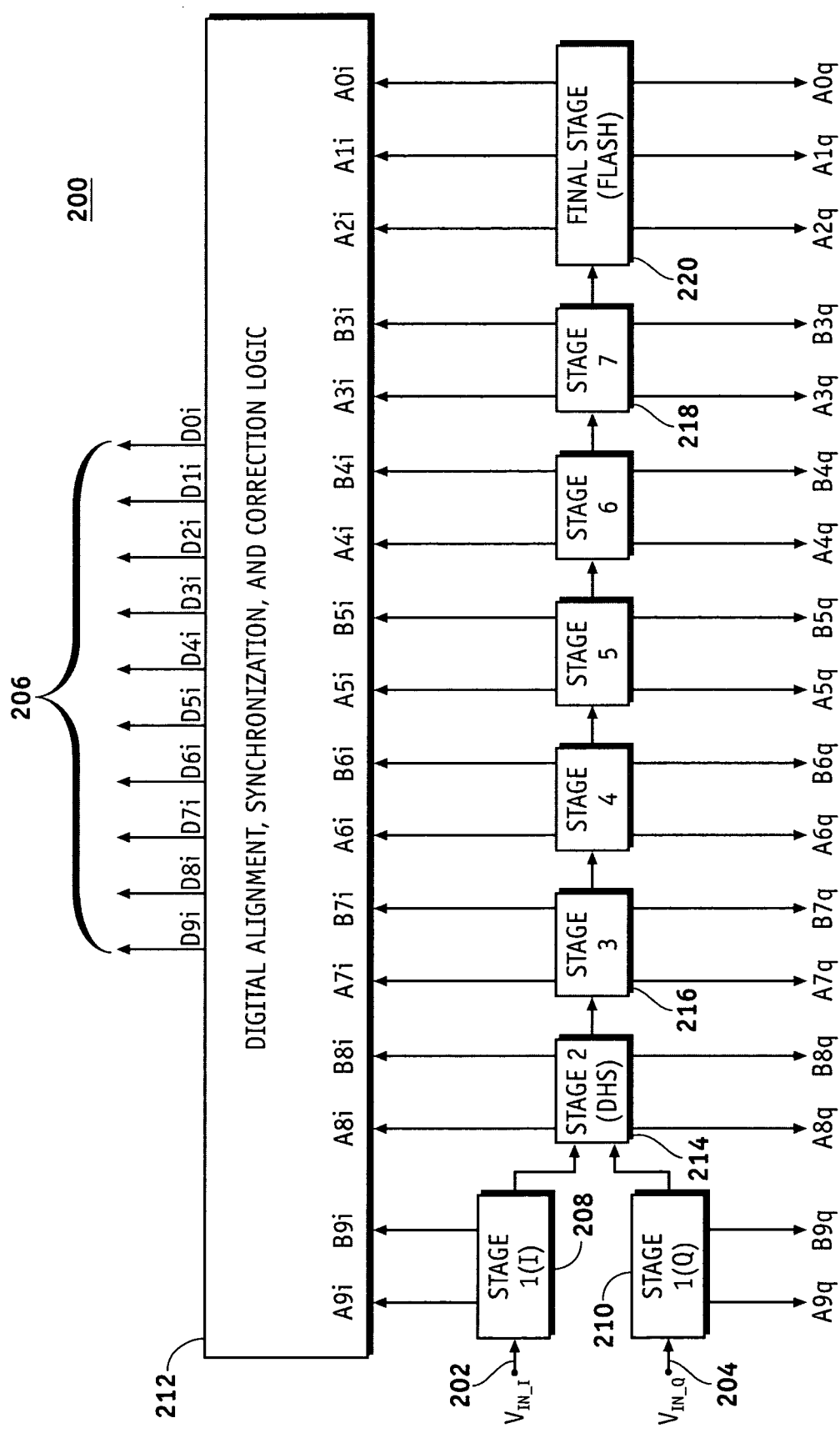
FIG. 2 is a schematic representation of a portion of a two-channel pipelined ADC configured in accordance with an example embodiment of the invention.

The generalized arrangement shown in FIG. 1 can be utilized in a number of practical applications. In this regard, FIG. 2 is a schematic representation of a portion of a two-channel pipelined ADC 200 configured in accordance with an example embodiment of the invention. ADC 200 shares some features and elements with ADC 100; such common features and elements will not be redundantly described in the context of ADC 200. In this example, the two channels represent an in-phase input channel and a quadrature input channel. For the sake of brevity and simplicity, FIG. 2 does not show some of the elements of ADC 200 associated with the handling of the quadrature input channel.

ADC 200 generally includes a first input node 202 for receiving a first analog input voltage signal (VIN_I), a second input node 204 for receiving a second analog input voltage signal (VIN_Q), and a number of output nodes 206 for generating a 10-bit digital output for the in-phase channel. The two input signals are concurrently sampled every other clock phase, and the 10-bit digital output for each channel is generated every other clock phase.

ADC 200 includes a first input stage 208 for the in-phase channel and a second input stage 210 for the quadrature channel. Input stages 208/210 concurrently sample their respective input voltage signals and concurrently generate their respective output voltage signals. As shown in FIG. 2, input stage 208 is suitably configured to generate a 2-bit digital output, which is routed to suitably configured alignment, synchronization, and correction logic 212. The outputs of the two input stages 208/210 are coupled to respective inputs of a DHS stage 214 (which, in this example, also serves as the second stage for ADC 200). DHS stage 214 concurrently samples the outputs generated by input stages 208/210, but alternately processes the samples and generates its output voltage samples using double sampling techniques. DHS stage 214 is suitably configured to generate a 2-bit digital output for the in-phase channel (which is routed to logic 212), and a 2-bit digital output for the quadrature channel.

The output of DHS stage 214 is coupled to an input of a third (middle or intermediate) stage 216. In this example, ADC 200 employs a total of five middle stages coupled in series, and each middle stage is suitably configured to generate a 2-bit digital output for the in-phase channel (which is routed to logic 212), and a 2-bit digital output for the quadrature channel. Each middle stage samples its input voltage signal during every clock phase and generates its output voltage signal during every clock phase.

The output of a seventh stage 218 is coupled to an input of a final flash stage 220. Final flash stage 220 processes the residual voltage from seventh stage 218 and generates a 3-bit digital output for the in-phase channel (this 3-bit digital output is routed to logic 212), and a 3-bit digital output for the quadrature channel. Ultimately, logic 212 receives a total of seventeen input bits from input stage 208, DHS stage 214, the middle stages, and final flash stage 220. In a practical embodiment of ADC 200, alignment, synchronization, and correction logic 212 includes a number of delay elements, such as flip-flops, that are suitably controlled to temporally align the seventeen input bits for synchronized presentation to suitable digital correction logic. The digital correction logic may be suitably configured to perform digital correction, bit consolidation, and/or other digital processing of the seventeen bits. In this example, the digital correction logic consolidates the number of bits from seventeen to ten and generates the resulting 10-bit digital output corresponding to a sampled analog input voltage.

Figure 3:
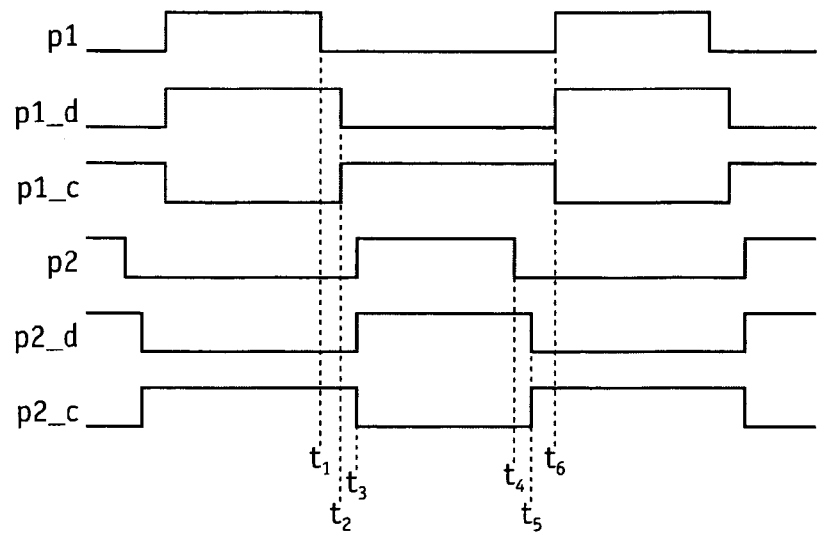
FIG. 3 is a diagram depicting the relative timing of example primary clock signals that influence the operation of the ADC shown in FIG. 2.
Figure 4:
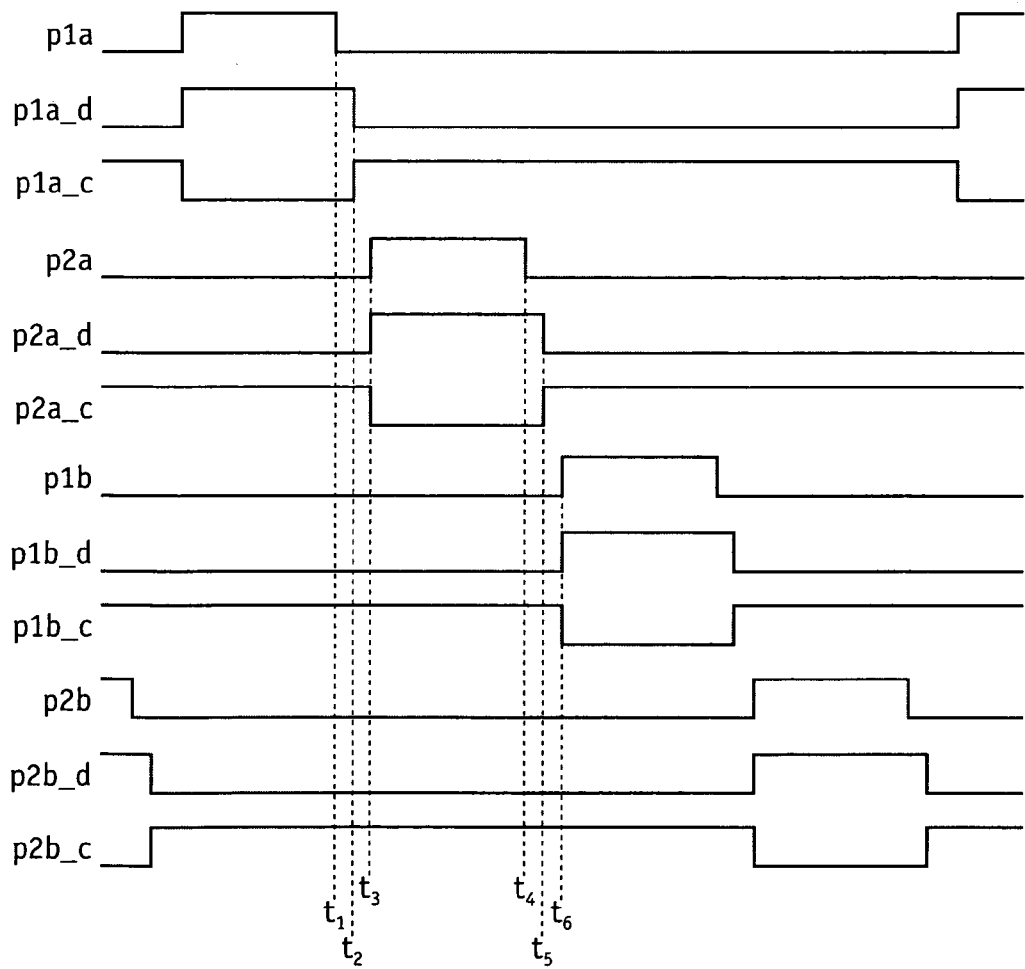
FIG. 4 is a diagram depicting the relative timing of example clock signal phases that influence the operation of the ADC shown in FIG. 2.

Proper operation of ADC 100 and ADC 200 depends upon the generation and maintenance of accurately timed clock signals and clock signal phases having non-overlapping characteristics and specific delay and timing requirements. In this regard, FIG. 3 is a diagram depicting the relative timing of example primary clock signals that influence the operation of ADC 200, and FIG. 4 is a diagram depicting the relative timing of example clock signal phases that influence the operation of ADC 200. Briefly, the signals in FIG. 4 enable DHS stage 214 to simultaneously sample two channel inputs, to delay the processing of one channel input, and to process the two channel inputs at a double sampling rate relative to the first input stages 208/210. The signals in FIG. 3 enable the other stages in ADC 200 to process their respective inputs and generate their respective outputs in an appropriate manner. In practice, the ADC stages utilize switched capacitances, and the clock signals and clock signal phases control the precise timing of the switched capacitances.

Figure 7:
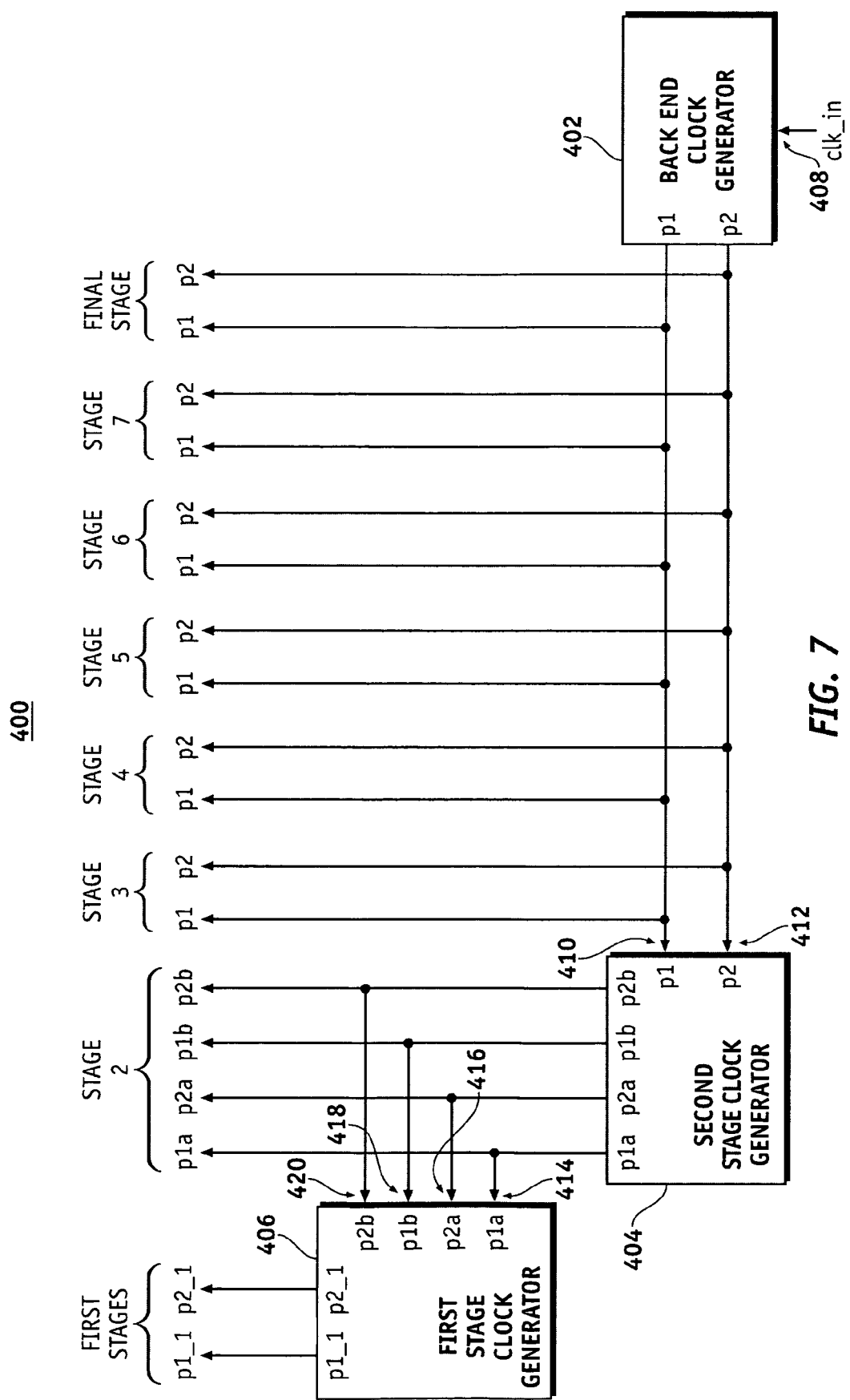
FIG. 7 is a schematic representation of a clock generator architecture configured in accordance with a first embodiment of the invention.
Figure 11:
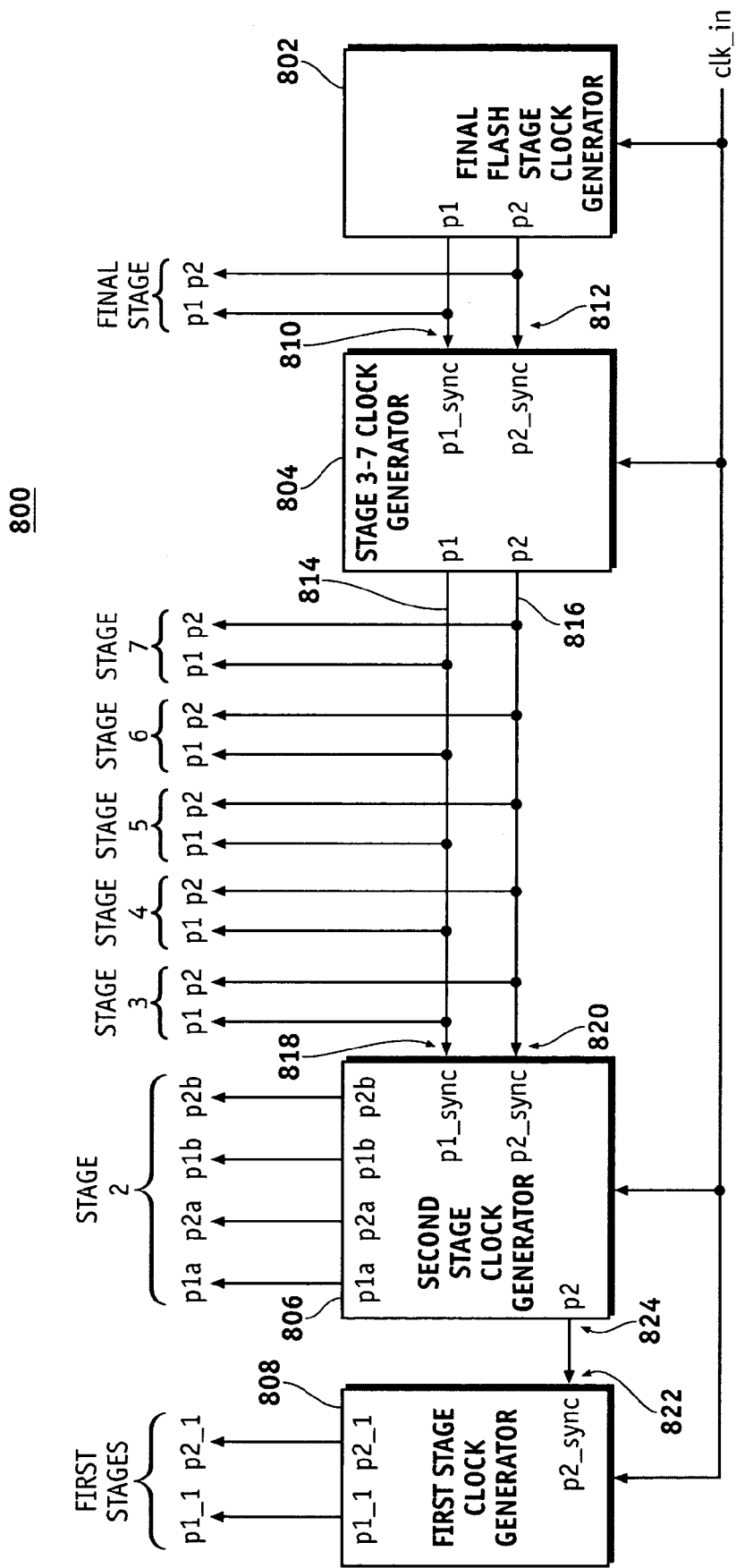
FIG. 11 is a schematic representation of a clock generator architecture configured in accordance with a second embodiment of the invention.

FIG. 7 and FIG. 11 depict example clock generator architectures that may be employed to generate the signals shown in FIG. 3 and FIG. 4. Each ADC stage receives the clock signals or clock phase signals identified in connection with the vertical arrows in FIG. 7 and FIG. 11. In addition, each ADC stage receives a delayed version of the identified clock signal and a complementary delayed version of the identified clock signal (although the delayed and complementary signals are not shown in FIG. 7 or FIG. 11 for the sake of simplicity). In contrast, the inputs to the various clock generator stages shown in FIG. 7 and FIG. 11 include the identified clock signals or clock phase signals without any associated delayed or complementary delayed signals.

Referring again to FIG. 3, the p1 and p2 signals represent the "primary" clock signals generated by the clock generator architectures. Notably, the p1 and p2 clock signals are non-overlapping (i.e., the falling edge of each p1 clock pulse always occurs before the rising edge of the next p2 clock pulse, and the falling edge of each p2 clock pulse always occurs before the rising edge of the next p1 clock pulse). The remaining signals shown in FIG. 3 (p1_d, p1_c, p2_d, and p2_c) represent clock signals or clock phases that may be based upon or derived from the p1 and p2 clock signals. The p1_d signal is a delayed clock signal that is based upon the p1 primary clock signal. In particular, the falling edge of the p1_d signal is delayed relative to the falling edge of the p1 signal. In FIG. 3, the time $t_2-_1$ represents this delay. Notably, however, the rising edges of the p1 and p1_d signals occur at the same time in this example. The p1_c signal is a complementary delayed clock signal that is based upon the p1 primary clock signal. In this example, the p1_c signal represents the complement of the p1_d signal. Accordingly, as depicted in FIG. 3, the leading edges of the p1_d and p1_c signals are aligned in time, and the trailing edges of the p1_d and p1_c signals are aligned in time. Similar relationships apply to the p2, p2_d, and p2_c signals. Notably, the p1 "family" of signals is non-overlapping with the p2 "family" of signals. In other words, any signal in the p1 family will be non-overlapping with all of the signals in the p2 family, and any signal in the p2 family will be non-overlapping with all of the signals in the p1 family.

Referring again to FIG. 4, the p1a and p1b signals represent two phases of the p1 signal, and the p2a and p2b signals represent two phases of the p2 signal. Thus, the time scales in FIG. 3 and FIG. 4 are at least nominally aligned with each other. For example, the p1a and p1b signals in FIG. 4 are nominally aligned with the pulses of the p1 signal in FIG. 3. In practice, however, the signals may not be so aligned and, therefore, the relationships depicted in FIG. 6 may apply. Notably, the p1a, p2a, p1b, and p2b clock phase signals are all mutually non-overlapping, as shown in FIG. 4. The remaining signals shown in FIG. 4 represent signals that may be based upon or derived from the p1a, p2a, p1b, and p2b signals. For example, the p1a_d signal is a delayed signal that is based upon the p1a signal. In particular, the falling edge of the p1a_d signal is delayed relative to the falling edge of the p1a signal. In FIG. 4, the time $t_2-t_1$ represents this delay. Notably, however, the rising edges of the p1a and p1a_d signals occur at the same time in this example. The p1a_c signal is a complementary delayed signal that is based upon the p1a signal. In this example, the p1a_c signal represents the complement of the p1a_d signal. Accordingly, as depicted in FIG. 4, the leading edges of the p1a_d and p1a_c signals are aligned in time, and the trailing edges of the p1a_d and p1a_c signals are aligned in time. Similar relationships apply to the p2a family of signals, the p1b family of signals, and the p2b family of signals. Notably, the p1a family of signals, the p2a family of signals, the p1b family of signals, and the p2b family of signals are mutually non-overlapping. For example, any signal in the p1a family will be non-overlapping with all of the signals in the p2a family, p1b family, and p2b family.

In a practical embodiment of ADC 200, specific timing relationships between the clock signals and clock phase signals are maintained to ensure proper operation of the switched capacitor elements in the ADC stages. For example, the falling edge of the p1 signal (at time $t_1$) occurs before the falling edge of the p1_d signal (at time $t_2$), and the falling edge of the p1_d signal (at time $t_2$) occurs before the rising edges of the p2 and p2_d signals (at time $t_3$). A similar sequence applies to the p2-derived clock edges: the falling edge of the p2 signal (at time $t_4$) occurs before the falling edge of the p2_d signal (at time $t_5$), and the falling edge of the p2_d signal (at time $t_5$) occurs before the rising edges of the p1 and p1_d signals (at time $t_6$). Note that the available settling time for a switched capacitor based stage of ADC 200 that produces an output during the p2 clock pulse starts when the p2_d signal rises and ends when the p2 signal falls at time $t_4$. As shown in FIG. 3, the available settling time can be maximized by designing the clock generator architecture such that the p2 and p2_d signals rise together at time $t_3$.

As indicated in FIG. 4, the timing relationships for the clocks used by the second ADC stage are similar to those of the other stages. In this case, the falling edge of the p1a signal (at time $t_1$) occurs before the falling edge of the p1a_d signal (at time $t_2$), and the falling edge of the p1a_d signal (at time $t_2$) occurs before the rising edges of the p2a and p2a_d signals (at time $t_3$). A similar sequence applies to the p2a-derived clock edges: the falling edge of the p2a signal (at time $t_4$) occurs before the falling edge of the p2a_d signal (at time $t_5$), and the falling edge of the p2a_d signal (at time $t_5$) occurs before the rising edges of the p1b and p1b_d signals (at time $t_6$). These timing relationships extend to each of the sequential DHS stage clock phase signals (p1a, p2a, p1b, and p2b) and their associated delayed and complementary clock phases. The clock generator architectures described herein are able to generate these clock signals and clock phase signals consistently and reliably despite random process variations and/or signal routing of varying lengths.

Figure 5:
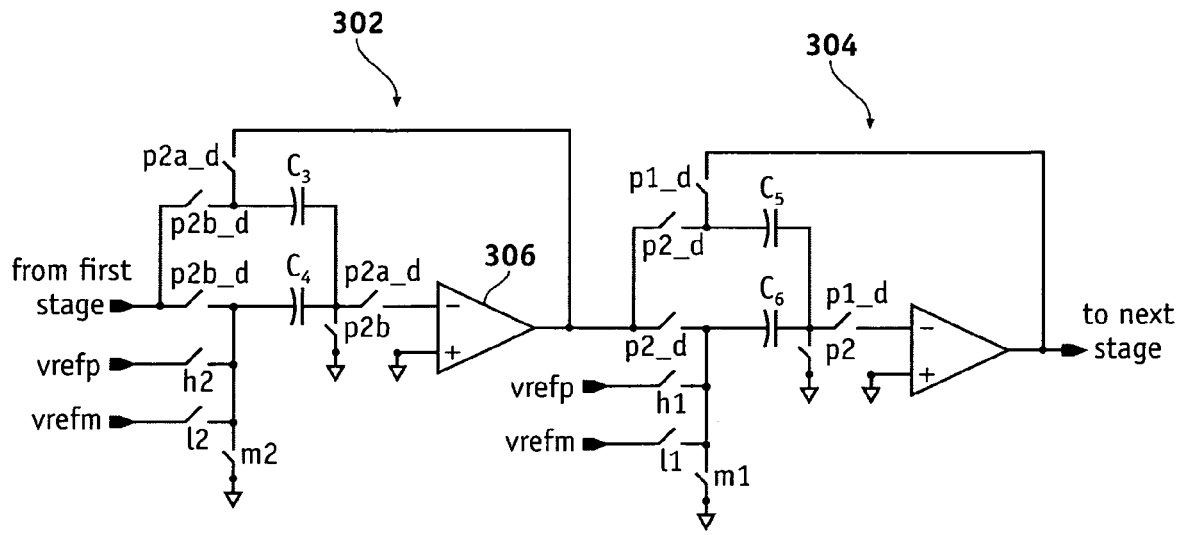
FIG. 5 is a simplified single-ended schematic diagram of switched capacitor circuits from two stages of a pipelined ADC configured in accordance with an example embodiment of the invention.
Figure 6:
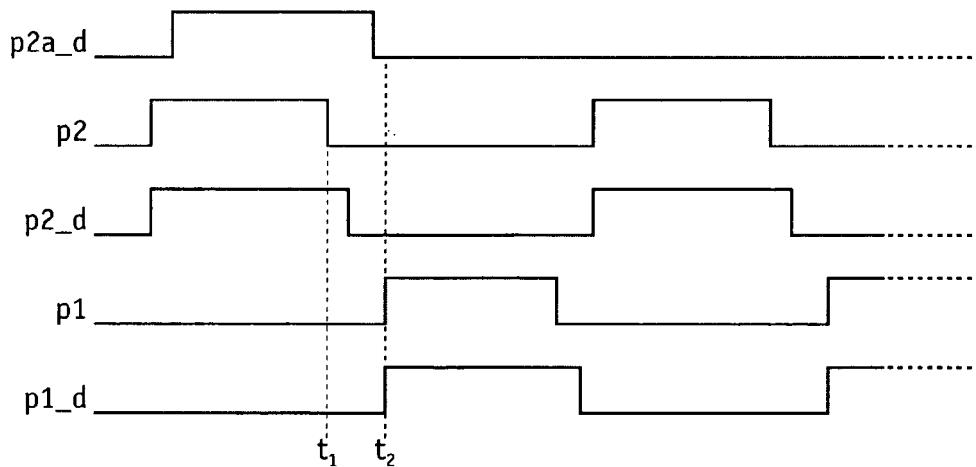
FIG. 6 is a diagram depicting the relative timing of example clock signals and phases that influence the operation of the circuits shown in FIG. 5.

FIG. 5 is a simplified single-ended schematic diagram of switched capacitor circuits from two stages of a pipelined ADC configured in accordance with an example embodiment of the invention, and FIG. 6 is a diagram depicting the relative timing of example clock signals and phases that influence the operation of the circuits shown in FIG. 5. FIG. 5 depicts a switched capacitor circuit 302 for the second stage of the ADC, and a switched capacitor circuit 304 for the third stage of the ADC. The operating details of such switched capacitor circuits are known to those skilled in the art and, therefore, will not be described in detail herein. Briefly, the switches depicted in FIG. 5 are controlled by the clock signals depicted in FIG. 6 and by switch control signals generated by digital logic associated with the ADC architecture. The switches in FIG. 5 are labeled with their respective governing clock/control signals. In this example, when a clock/control signal is high, the associated switch is closed, and when a clock/control signal is low, the associated switch is open. Thus, when the p2b and p2b_d signals are high, and the p2a_d signal is low, the C3 and C4 capacitors charge to sample the input voltage from the first stage. When the p2b and p2b_d signals are low and the p2a_d signal is high, the C3 and C4 capacitors are coupled to an amplifier 306, which generates an output voltage at its output node.

As mentioned above, a practical embodiment requires stringent timing between the stages of a pipelined ADC, as well as within an ADC stage. Referring to the timing diagram of FIG. 6, the falling edge of the p2 signal (at time t1) occurs before the rising edge of the p1 and p1_d signal (at time t2) in order to ensure optimal operation of the ADC. A similar relationship also exists between the clock signals from the first stage and the clock signals from the second (DHS) stage: the falling edges of the p1a, p2a, p1b, and p2b signals occur before the falling edge of the p2_1 signal (see the clock signal labels in FIG. 7 and FIG. 11). Thus, a clock generator architecture used by a practical embodiment of the ADC must maintain these interstage timing relationships as well as the intrastage timing relationships described above.

FIG. 7 is a schematic representation of a clock generator architecture 400 configured in accordance with one example embodiment of the invention. Clock generator architecture 400 is configured to generate multiple non-overlapping clock signals and clock phases that may be utilized in various applications, such as a pipelined ADC as described above. Indeed, clock generator architecture 400 is suitably configured for operation with ADC 200 (see FIG. 2). In this regard, the various clock signals and clock phase signals generated by clock generator architecture 400 can be used as inputs to the two first ADC stages (one for the in-phase channel and one for the quadrature channel), to the DHS/second ADC stage, to the five intermediate ADC stages, and to the final ADC stage, as identified in FIG. 7. Clock generator architecture 400 generally includes a back end clock generator 402, a second stage clock generator 404 coupled to back end clock generator 402, and a first stage clock generator 406 coupled to second stage clock generator 404. In operation, the various clock signals and clock phase signals are generated in a propagated manner from back end clock generator 402 to first stage clock generator 406.

Back end clock generator 402 includes an input node 408 for a main clock signal (labeled clk_in) that serves as a foundation for the various clock signals and clock phase signals. In the example embodiment, the main clock signal is realized as a square wave having a 50% duty cycle. The main clock signal may have a frequency of about 50 MHz, which is suitable for use with a practical ADC. Back end clock generator 402 is suitably configured to generate, in response to the main clock signal, a first primary clock signal (labeled p1) and a second primary clock signal (labeled p2) that is non-overlapping with the p1 clock signal. Although not separately depicted in FIG. 7, back end clock generator 402 also generates, in response to the main clock signal: a first delayed clock signal (p1_d), a second delayed clock signal (p2_d) that is non-overlapping with the p1_d signal, a first complementary delayed clock signal (p1_c), and a second complementary delayed clock signal (p2 c) that is non-overlapping with the p1_c signal.

In the example ADC embodiment described herein, the six output signals from back end clock generator 402 (p1, p1_d, p1_c, p2, p2_d, and p2_c) are routed to the final ADC stage and to the third through seventh ADC stages. The timing relationships of these six signals are depicted in FIG. 3. For the sake of simplicity, only the primary clock signal labels (p1 and p2) are shown leading to the ADC stages. It should be understood that these labels are intended to represent the p1 family of signals and the p2 family of signals, respectively.

Second stage clock generator 404 includes a first input node 410 for a first signal that is based upon the first primary clock signal (p1), and a second input node 412 for a second signal that is based upon the second primary clock signal (p2). In this example, the first primary clock signal (p1) and the second primary clock signal (p2) themselves serve as the inputs to second stage clock generator 404. Notably, these inputs to second stage clock generator 404 do not include the delayed or complementary variants of the p1 and p2 signals. Second stage clock generator 404 is suitably configured to generate, in response to the p1 and p2 primary clock signals, a first clock phase signal (labeled p1a) based upon the p1 primary clock signal, a second clock phase signal (labeled p1b) based upon the p1 primary clock signal, a third clock phase signal (labeled p2a) based upon the p2 primary clock signal, and a fourth clock phase signal (labeled p2b) based upon the p2 primary clock signal. In this example, the p1a, p1b, p2a, and p2b signals are mutually non-overlapping. Although not separately depicted in FIG. 7, second stage clock generator 404 also generates, in response to the p1 and p2 primary clock signals: a first delayed clock phase signal (p1a_d) based upon the p1 primary clock signal, a second delayed clock phase signal (p1b_d) based upon the p1 primary clock signal, a third delayed clock phase signal (p2a_d) based upon the p2 primary clock signal, a fourth delayed clock phase signal (p2b_d) based upon the p2 primary clock signal, a first complementary delayed clock phase signal (p1a_c) based upon the p1 primary clock signal, a second complementary delayed clock phase signal (p1b_c) based upon the p1 primary clock signal, a third complementary delayed clock phase signal (p2a_c) based upon the p2 primary clock signal, and a fourth complementary delayed clock phase signal (p2b_c) based upon the p2 primary clock signal. The timing relationships of these various signals are depicted in FIG. 4. Notably, the p1a_d, p1b_d, p2a_d, and p2b_d clock phase signals are mutually non-overlapping, and the p1a_c, p1b_c, p2a_c, and p2b_c clock phase signals are mutually non-overlapping.

In the example ADC embodiment described herein, the twelve output signals from second stage clock generator 404 (p1a, p1a_d, p1a_c, p2a, p2a_d, p2a_c, p1b, p1b_d, p1b_c, p2b, p2b_d, and p2b_c) are routed to the second ADC stage, which is also referred to as the DHS stage. For the sake of simplicity, FIG. 7 only shows the primary clock signal labels (p1a, p2a, p1b, and p2b) leading to the second ADC stage. It should be understood that these labels are intended to represent the p1a family of signals, the p2a family of signals, the p1b family of signals, and the p2b family of signals, respectively.

First stage clock generator 406, which is coupled to the output nodes of second stage clock generator 404, is appropriately configured to generate non-overlapping clock signals for use by the first ADC stage. In practice, first stage clock generator 406 generates its clock signals under the control of second stage clock generator 404.

First stage clock generator 406 includes a first input node 414 for the p1a clock phase signal, a second input node 416 for the p2a clock phase signal, a third input node 418 for the p1b clock phase signal, and a fourth input node 420 for the p2b clock phase signal. Notably, these inputs to first stage clock generator 406 do not include any delayed or complementary variants. In response to these input signals, first stage clock generator 406 provides a first first-stage clock signal (labeled p1_1) and a second first-stage clock signal (labeled p2_1) that is non-overlapping with the p1_1 signal. In this example, the p1_1 signal has the same characteristics as the p1 signal used in the back end stages, and the p2_1 signal has the same characteristics as the p2 signal used in the back end stages (the "_1" notation simply indicates that this signal is specifically for use with the first stages). Moreover, although not separately depicted in FIG. 7, first stage clock generator 406 also generates, in response to its input signals: a delayed first-stage clock signal (p1_1_d) based upon the p1_1 clock signal, a delayed first-stage clock signal (p2_1_d) based upon the p2_1 clock signal, a complementary delayed first-stage clock signal (p1_1_c) based upon the p1_1 clock signal, and a complementary delayed first-stage clock signal (p2_1_c) based upon the p2_1 clock signal. Notably, the p1_1_d and p2_1_d signals are non-overlapping, and the p1_1_c and p2_1_c signals are non-overlapping. As described above for the other clock signal stages, the p1_1 family of signals is completely non-overlapping with respect to the p2_1 family of signals.

In the example ADC embodiment described herein, the six output signals from first stage clock generator 406 (p1_1, p1_1_d, p1_1_c, p2_1, p2_1_d, and p2_1_c) are routed to the first ADC stages. For the sake of simplicity, FIG. 7 only shows the primary clock signal labels (p1_1 and p2_1) leading to the first ADC stages. It should be understood that these labels are intended to represent the p1_1 family of signals and the p2_1 family of signals, respectively.

Figure 8:
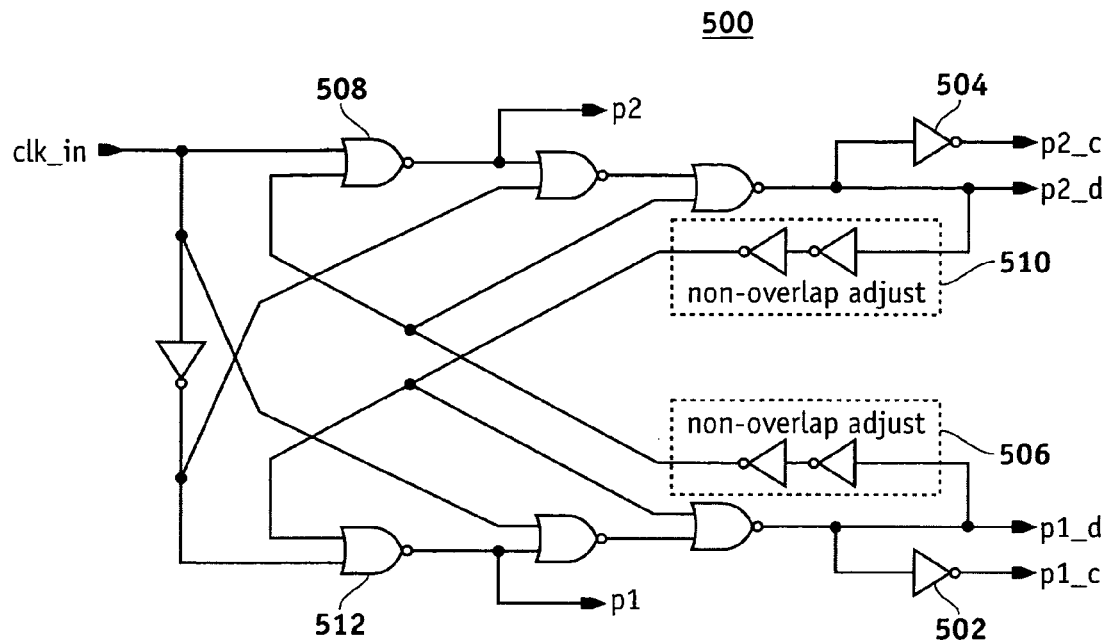
FIG. 8 is a schematic representation of a back end clock generator suitable for use in the architecture shown in FIG. 7.

FIG. 8 is a schematic representation of a back end clock generator 500 suitable for use in clock generator architecture 400. In this example, back end clock generator 500 is appropriately configured to generate the respective non-overlapping clock signals for the third through the final stages of ADC 200. The basic operation of back end clock generator 500 is described in U.S. Pat. No. 5,818,276, which is incorporated by reference herein. Back end clock generator 500 is designed to raise the primary (p1 and p2) clock edges and the delayed clock edges (p1_d and p2_d) together, thereby maximizing the available settling time as mentioned previously and as depicted in FIG. 3. Notably, back end clock generator 500 is able to increase or decrease the non-overlap time (time $t_3-t_2$ in FIG. 3) by adjusting the propagation delay through non-overlap adjustment arrangements.

Briefly, back end clock generator 500 receives the main clock signal as an input and generates the p1, p1_d, p1_c, p2, p2_d, and p2_c signals using two branches of digital logic elements. An inverter 502 creates the p1_c signal by inverting the p1_d signal, and an inverter 504 creates the p2_c signal by inverting the p2_d signal. A non-overlap adjustment arrangement 506 is coupled between the output node for the p1_d signal and one input node of a NOR gate 508. The other input node of NOR gate 508 receives the main clock signal, as shown in FIG. 8. Another non-overlap adjustment arrangement 510 is coupled between the output node for the p2_d signal and one input node of a NOR gate 512. In this example, the other input node of NOR gate 512 receives an inverted representation of the main clock signal. As illustrated in FIG. 8, each of the non-overlap adjustment arrangements 506/510 is realized as a pair of inverters that introduce a desired amount of delay. Additional pairs of inverters may be used to increase this delay. Alternatively, back end clock generator 500 may employ any known means of adjusting the delay through the respective propagation paths.

Figure 9:
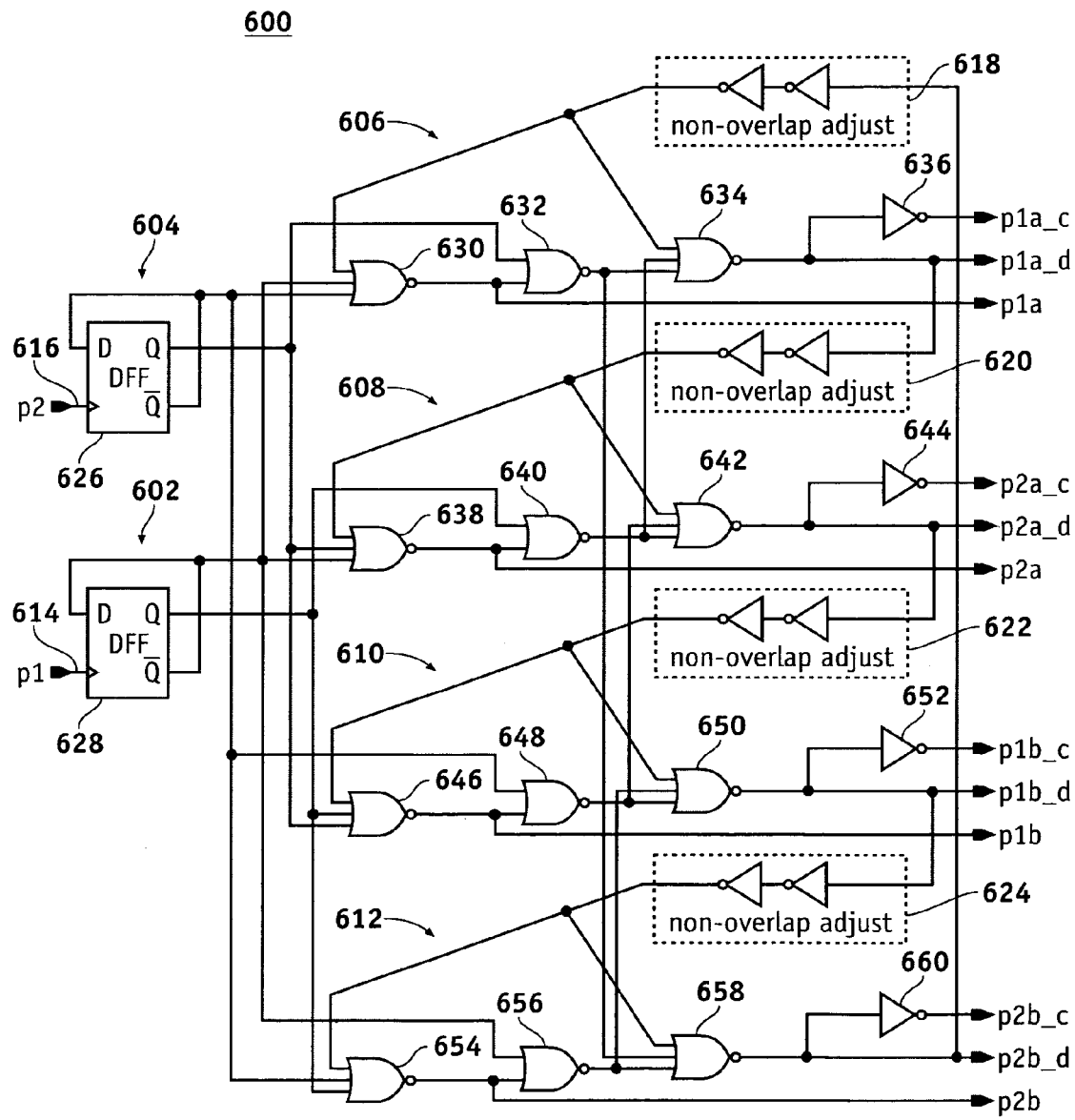
FIG. 9 is a schematic representation of a second stage clock generator suitable for use in the architecture shown in FIG. 7.

FIG. 9 is a schematic representation of a second stage clock generator 600 suitable for use in clock generator architecture 400. In this example, second stage clock generator 600 is appropriately configured to generate the respective non-overlapping clock signals for the second (DHS) stage of ADC 200. Briefly, second stage clock generator 600 receives the p1 and p2 primary clock signals as inputs, and generates the p1a family of signals, the p2a family of signals, the p1b family of signals, and the p2b family of signals as outputs using four clock signal generation branches of digital logic elements. Second stage clock generator 600 generally includes a first frequency divider 602, a second frequency divider 604, and four clock signal generation branches (identified by reference numbers 606, 608, 610, and 612). Each of the clock signal generation branches is coupled to the first frequency divider 602 and to the second frequency divider 604.

First frequency divider 602 may be realized as a D-type flip-flop connected as shown in FIG. 9. First frequency divider 602 has an input node 614 for the p1 primary clock signal, and two output nodes (corresponding to the Q and inverted-Q flip-flop outputs). First frequency divider 602 is suitably configured to divide the p1 clock signal by two in frequency to obtain first and second trigger signals at the Q and inverted-Q output nodes of the first frequency divider 602. The inverted-Q signal starts or triggers the sequence for clock signal generation branches 606/608, while the Q signal starts or triggers the sequence for clock signal generation branches 610/612. The third input (depicted as the lowest input) for the first NOR gate in each clock signal generation branch represents the trigger for each branch. As the respective trigger signal rises, the output of the corresponding NOR gate is forced low, thereby triggering the sequence in which the p1a (or p1b) signal goes low followed some time later by the p1a_d (or p1b_d) signal, which in turn causes the p2a (or p2b) and p2a_d (or p2b_d) signals in the next lowest branch to simultaneously rise.

First frequency divider 602 divides the p1 clock signal by two in frequency such that the rising clock edges that are used to trigger the clock generation sequence are generated at the desired times. For example, every other time the p1 clock signal rises, the inverted-Q output rises, thereby forcing the output of NOR gate 638 low, which then initiates the clock generation sequence in which the p2a signal goes low followed by the signal p2a_d going low. When the p2a_d signal goes low, it is passed through non-overlap adjustment arrangement 622, which forces signals p1b and p1b_d high simultaneously. On the alternate rising edge of clock signal p1, the Q output of flip-flop 628 rises and initiates a similar sequence by forcing the output of NOR gate 654 low (p2b), which is followed by p2b_d, which then forces p1a and p1a_d high simultaneously. In practice, the frequency divided clock signal produced by first frequency divider 602 will resemble the p1 signal where the signal remains high for twice as long and remains low for twice as long. For desired operation of the clock generator architecture, rising edges corresponding to each rising edge of p1 and p2 are required, but once the rising edges occur, the signal needs to stay high for an entire clock period (p1 or p2). The frequency dividers 602/604 generate the four desired edges, the signals stay high for the desired time periods, and the clocks (p1a, p2a, etc.) are generated at the correct frequency.

Similarly, second frequency divider 604 may be realized as a D-type flip-flop connected as shown in FIG. 9. Second frequency divider 604 has an input node 616 for the p2 primary clock signal, and two output nodes (corresponding to the Q and inverted-Q flip-flop outputs). Second frequency divider 604 is suitably configured to divide the p2 clock signal by two in frequency to obtain a second trigger signal at the output node of the second frequency divider 604. Second frequency divider 604 divides the p2 clock signal by two in frequency such that the rising clock edges that are used to trigger the clock generation sequence are generated at the desired times. For example, every other time the p2 clock signal rises, the inverted-Q output rises, thereby forcing the output of NOR gate 630 low, which then initiates the clock generation sequence in which the p1a signal goes low followed by the p1a_d signal going low. When the p1a_d signal goes low, it is passed through non-overlap adjustment arrangement 620, which forces the p2a and p2a_d signals high simultaneously. On the alternate rising edge of clock signal p2, the Q output of flip-flop 626 rises and initiates a similar sequence by forcing the output of NOR gate 646 low (p1b), which is followed by the p1b_d signal, which then forces the p2b and p2b_d signals high simultaneously.

In this example embodiment, the trigger signals influence the operation of the four clock signal generation branches, which propagate digital logic levels until the various clock signal phases are obtained. For example, clock signal generation branch 606 is suitably configured to generate, in response to the first and second trigger signals, the p1a clock phase signal, which is based upon the p1 clock signal. Similarly, clock signal generation branch 608 is suitably configured to generate, in response to the first and second trigger signals, the p2a clock phase signal, which is based upon the p2 clock signal. Likewise, clock signal generation branch 610 is suitably configured to generate, in response to the first and second trigger signals, the p1b clock phase signal, which is based upon the p1 clock signal. Finally, clock signal generation branch 612 is suitably configured to generate, in response to the first and second trigger signals, the p2b clock phase signal, which is based upon the p2 clock signal. Notably, second stage clock generator 600 generates the p1a, p2a, p1b, and p2b signals such that they are mutually non-overlapping (see FIG. 4).

As mentioned above, second stage clock generator 600 also generates, in response to the first and second trigger signals, the delayed and complementary variants of the p1a, p2a, p1b, and p2b signals. In this regard, clock signal generation branch 606 also generates the p1a_d and p1a_c signals, clock signal generation branch 608 also generates the p2a_d and p2a_c signals, clock signal generation branch 610 also generates the p1b_d and p1b_c signals, and clock signal generation branch 612 also generates the p2b_d and p2b_c signals. Second stage clock generator 600 generates the p1a_d, p2a_d, p1b_d, and p2b_d signals such that they are mutually non-overlapping, and generates the p1a_c, p2a_c, p1b_c, and p2b_c signals such that they are mutually non-overlapping (see FIG. 4).

In this example, second stage clock generator 600 includes four non-overlap adjustment arrangements. One non-overlap adjustment arrangement 618 is coupled between clock signal generation branch 606 and clock signal generation branch 612. Another non-overlap adjustment arrangement 620 is coupled between clock signal generation branch 606 and clock signal generation branch 608. Another non-overlap adjustment arrangement 622 is coupled between clock signal generation branch 608 and clock signal generation branch 610. The last non-overlap adjustment arrangement 624 is coupled between clock signal generation branch 610 and clock signal generation branch 612. These non-overlap adjustment arrangements may function as described above in connection with back end clock generator 500.

In the example embodiment shown in FIG. 9, the D-type flip-flop 626 used for frequency divider 604 is arranged such that its inverted-Q output node is coupled to its D input node. Similarly, the D-type flip-flop 628 used for frequency divider 602 is arranged such that its inverted-Q output node is coupled to its D input node. Clock signal generation branch 606 includes an input NOR gate 630, an intermediate NOR gate 632 coupled to input NOR gate 630, an output NOR gate 634 coupled to intermediate NOR gate 632, and an inverter 636 coupled to output NOR gate 634. Clock signal generation branch 608 includes an input NOR gate 638, an intermediate NOR gate 640 coupled to input NOR gate 638, an output NOR gate 642 coupled to intermediate NOR gate 640, and an inverter 644 coupled to output NOR gate 642. Clock signal generation branch 610 includes an input NOR gate 646, an intermediate NOR gate 648 coupled to input NOR gate 646, an output NOR gate 650 coupled to intermediate NOR gate 648, and an inverter 652 coupled to output NOR gate 650. Clock signal generation branch 612 includes an input NOR gate 654, an intermediate NOR gate 656 coupled to input NOR gate 654, an output NOR gate 658 coupled to intermediate NOR gate 656, and an inverter 660 coupled to output NOR gate 658.

Input NOR gate 630 receives the following as inputs: the output of non-overlap adjustment arrangement 618, the inverted-Q output of flip-flop 628, and the inverted-Q output of flip-flop 626. The output of input NOR gate 630 corresponds to the p1a signal in this example. Input NOR gate 638 receives the following as inputs: the output of non-overlap adjustment arrangement 620, the Q output of flip-flop 626, and the inverted-Q output of flip-flop 628. The output of input NOR gate 638 corresponds to the p2a signal in this example. Input NOR gate 646 receives the following as inputs: the output of non-overlap adjustment arrangement 622, the Q output of flip-flop 628, and the Q output of flip-flop 626. The output of input NOR gate 646 corresponds to the p1b signal in this example. Input NOR gate 654 receives the following as inputs: the output of non-overlap adjustment arrangement 624, the inverted-Q output of flip-flop 626, and the Q output of flip-flop 628. The output of input NOR gate 654 corresponds to the p2b signal in this example.

Intermediate NOR gate 632 is coupled to flip-flop 626 to receive the Q output of flip-flop 626 as a first input signal, and is coupled to the output node of NOR gate 630 to receive the output of NOR gate 630 as a second input signal. In this example embodiment, the output of intermediate NOR gate 632 serves as a third input to NOR gate 634, and as a second input to NOR gate 658. Intermediate NOR gate 640 is coupled to flip-flop 628 to receive the Q output of flip-flop 628 as a first input signal, and is coupled to the output node of NOR gate 638 to receive the output of NOR gate 638 as a second input signal. In this example embodiment, the output of intermediate NOR gate 640 serves as a third input to NOR gate 642, and as a second input to NOR gate 634. Intermediate NOR gate 648 is coupled to flip-flop 626 to receive the inverted-Q output of flip-flop 626 as a first input signal, and is coupled to the output node of NOR gate 646 to receive the output of NOR gate 646 as a second input signal. In this example embodiment, the output of intermediate NOR gate 648 serves as a third input to NOR gate 650, and as a second input to NOR gate 642. Intermediate NOR gate 656 is coupled to flip-flop 628 to receive the inverted-Q output of flip-flop 628 as a first input signal, and is coupled to the output node of NOR gate 654 to receive the output of NOR gate 654 as a second input signal. In this example embodiment, the output of intermediate NOR gate 656 serves as a third input to NOR gate 658, and as a second input to NOR gate 650.

Output NOR gate 634 is coupled to non-overlap adjustment arrangement 618 to receive the output of non-overlap adjustment arrangement 618 as its first input signal, is coupled to receive the output of intermediate NOR gate 640 as its second input signal, and is coupled to receive the output of intermediate NOR gate 632 as its third input signal. Output NOR gate 634 generates the p1a_d signal in this example, and inverter 636 inverts the p1a_d signal to generate the p1a_c signal. In addition, output NOR gate 634 is coupled to non-overlap adjustment arrangement 620 such that the p1a_d signal serves as an input to non-overlap adjustment arrangement 620. Output NOR gate 642 is coupled to non-overlap adjustment arrangement 620 to receive the output of non-overlap adjustment arrangement 620 as its first input signal, is coupled to receive the output of intermediate NOR gate 648 as its second input signal, and is coupled to receive the output of intermediate NOR gate 640 as its third input signal. Output NOR gate 642 generates the p2a_d signal in this example, and inverter 644 inverts the p2a_d signal to generate the p2a_c signal. In addition, output NOR gate 642 is coupled to non-overlap adjustment arrangement 622 such that the p2a_d signal serves as an input to non-overlap adjustment arrangement 622. Output NOR gate 650 is coupled to non-overlap adjustment arrangement 622 to receive the output of non-overlap adjustment arrangement 622 as its first input signal, is coupled to receive the output of intermediate NOR gate 656 as its second input signal, and is coupled to receive the output of intermediate NOR gate 648 as its third input signal. Output NOR gate 650 generates the p1b_d signal in this example, and inverter 652 inverts the p1b_d signal to generate the p1b_c signal. In addition, output NOR gate 650 is coupled to non-overlap adjustment arrangement 624 such that the p1b_d signal serves as an input to non-overlap adjustment arrangement 624. Output NOR gate 658 is coupled to non-overlap adjustment arrangement 624 to receive the output of non-overlap adjustment arrangement 624 as its first input signal, is coupled to receive the output of intermediate NOR gate 632 as its second input signal, and is coupled to receive the output of intermediate NOR gate 656 as its third input signal. Output NOR gate 658 generates the p2b_d signal in this example, and inverter 660 inverts the p2b_d signal to generate the p2b_c signal. In addition, output NOR gate 658 is coupled to non-overlap adjustment arrangement 618 such that the p2b_d signal serves as an input to non-overlap adjustment arrangement 618.

The basic operation of second stage clock generator 600 is similar to the operation of back end clock generator 500, however, the input clock and its complement (p1 and p2 from the back end clock generator) are divided by two in frequency using the D-type flip-flops 626/628, then used to trigger each of the four clock signal generation branches in the appropriate sequence to generate all of the desired clock signals. Once a rising edge reaches the first NOR gate in a given branch, the associated primary clock output (p1a for example) falls, followed by its delayed version (p1a_d for example). The falling edge of the delayed signal is then further delayed as needed using the respective non-overlap adjustment arrangement as described above, and then fed back to raise the primary and delayed clock outputs (p2a and p2a_d for example) from the next/lower clock signal generation branch. In this example, these next two signals are raised concurrently.

Each row of NOR gates and the NOR gates in the immediately following row function in a manner similar to that described in U.S. Pat. No. 5,818,276, except that the clock outputs from the current row trigger those from the next row rather than the previous row as in the back end clock generator 500. Finally, when the sequence is complete and the clock outputs from the fourth row fall, they are delayed as needed and then fed back to the first row and the sequence repeats. The divided-by-two clock signals are also used in the first and third columns of NOR gates to suppress glitches that might otherwise occur. Thus, the second stage clock generator 600, including the multiple feedback paths and glitch suppression, produces all of the desired clock signals while maximizing stage settling time and maintaining the correct timing relationships despite random process variations that occur in practical implementations. Since (in this example) second stage clock generator 600 is used to generate the clocks only for the DHS stage of ADC 200, variations due to differences in signal routing can also be minimized. It should be appreciated that although FIG. 9 depicts what appears to be several three-input NOR gates, true three-input NOR gates with three stacked PMOS transistors are not required. The third NOR gate input is included to control a third NMOS transistor in order to hold the NOR gate output low when desired, thus suppressing unwanted glitches.

Figure 10:
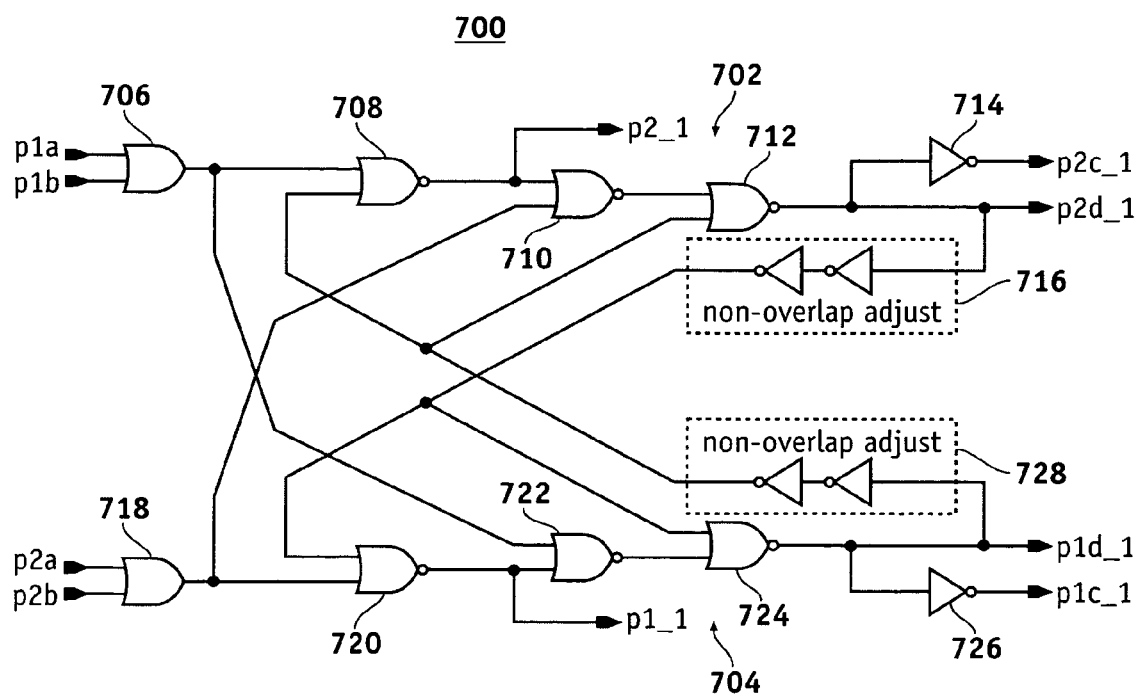
FIG. 10 is a schematic representation of a first stage clock generator suitable for use in the architecture shown in FIG. 7.

FIG. 10 is a schematic representation of a first stage clock generator 700 suitable for use in clock generator architecture 400. In this example, first stage clock generator 700 is appropriately configured to generate the respective non-overlapping clock signals for the two first stages (one for the in-phase channel and one for the quadrature channel) of ADC 200. Briefly, first stage clock generator 700 receives four clock phase signals (p1a, p1b, p2a, and p2b in this example) as inputs and generates the p1__1 family of signals and the p2__1 family of signals using two branches of digital logic elements. The basic operation of first stage clock generator 700 is similar to the operation of back end clock generator 500, except that the equivalent input clocks are derived by performing one OR function on the p1a and p1b signals generated by the second stage clock generator, and by performing another OR function on the p2a and p2b signals generated by the second stage clock generator, thereby ensuring the desired synchronization between stages as depicted in FIG. 6. Moreover, first stage clock generator 700 is able to increase or decrease the non-overlap time (time $t_2 - t_1$ in FIG. 6) by adjusting the propagation delay through non-overlap adjustment arrangements.

First stage clock generator 700 generally includes a first clock signal generation branch 702 coupled to a second clock signal generation branch 704. First branch 702 includes an OR gate 706, an input NOR gate 708, an intermediate NOR gate 710, an output NOR gate 712, an inverter 714, and a non-overlap adjustment arrangement 716. Similarly, second branch 704 includes an OR gate 718, an input NOR gate 720, an intermediate NOR gate 722, an output NOR gate 724, an inverter 726, and a non-overlap adjustment arrangement 728.

OR gate 706 is configured to receive two clock phase signals, such as the p1a and p1b signals in this example, and OR gate 718 is configured to receive two additional clock phase signals, such as the p2a and p2b signals in this example. The output node of OR gate 706 is coupled to one input node of NOR gate 708, which receives the output of non-overlap adjustment arrangement 728 at its other input node. In this example, NOR gate 708 generates a first-stage clock signal (labeled p2__1) suitable for clocking a first stage of ADC 200. Similarly, the output node of OR gate 718 is coupled to one input node of NOR gate 720, which receives the output of non-overlap adjustment arrangement 716 at its other input node. In this example, NOR gate 720 generates another first-stage clock signal (labeled p1__1) suitable for clocking a first stage of ADC 200. The remainder of first stage clock generator 700 operates as described above in connection with back end clock generator 500.

FIG. 11 is a schematic representation of a clock generator architecture 800 configured in accordance with a second embodiment of the invention. Clock generator architecture 800 is configured to generate multiple non-overlapping clock signals and clock phases that may be utilized in various applications, such as a pipelined ADC as described above. Indeed, clock generator architecture 800 is suitably configured for operation with ADC 200 (see FIG. 2). In this regard, the various clock signals and clock phase signals generated by clock generator architecture 800 can be used as inputs to the two first ADC stages (one for the in-phase channel and one for the quadrature channel), to the DHS/second ADC stage, to the five intermediate ADC stages, and to the final ADC stage, as identified in FIG. 11. Clock generator architecture 800 generally includes a back end clock generator 802, an intermediate stage clock generator 804 coupled to back end clock generator 802, a second stage clock generator 806 coupled to intermediate stage clock generator 804, and a first stage clock generator 808 coupled to second stage clock generator 806.

Each of these clock generator stages receives a main clock signal (labeled clk_in) as an input. As described above, the main clock signal may be a square wave having a 50% duty cycle and a frequency of about 50 MHz.

In operation, the various clock signals and clock phase signals are generated in a propagated manner from back end clock generator 802 to first stage clock generator 808. Back end clock generator 802 is suitably configured to generate, in response to the main clock signal, a first primary clock signal (labeled p1) and a second primary clock signal (labeled p2) that is non-overlapping with the p1 clock signal. Although not separately depicted in FIG. 11, back end clock generator 802 also generates, in response to the main clock signal: a first delayed clock signal (p1_d), a second delayed clock signal (p2_d) that is non-overlapping with the p1_d signal, a first complementary delayed clock signal (p1_c), and a second complementary delayed clock signal (p2_c) that is non-overlapping with the p1_c signal.

In the example ADC embodiment described herein, the six output signals from back end clock generator 802 (p1, p1_d, p1_c, p2, p2_d, and p2_c) are routed to the final ADC stage. The timing relationships of these six signals are depicted in FIG. 3. For the sake of simplicity, only the primary clock signal labels (p1 and p2) are shown leading to the final ADC stage. It should be understood that these labels are intended to represent the p1 family of signals and the p2 family of signals, respectively.

Intermediate stage clock generator 804 includes a first synchronization input node 810 for receiving a first synchronization signal that is based upon the first primary clock signal (p1), and a second synchronization input node 812 for receiving a second synchronization signal that is based upon the second primary clock signal (p2). In this example, input node 810 and input node 812 are coupled to back end clock generator 802, and the first primary clock signal (p1) and the second primary clock signal (p2) themselves serve as the inputs to intermediate stage clock generator 804. Notably, these inputs to intermediate stage clock generator 804 do not include the delayed or complementary variants of the p1 and p2 signals. Intermediate stage clock generator 804 is suitably configured to generate, in response to the first and second synchronization signals, a duplicate first primary clock signal 814 (labeled p1) corresponding to the first primary clock signal, and a second duplicate primary clock signal 816 (labeled p2) corresponding to the second primary clock signal. In this example, clock signal 814 and clock signal 816 are non-overlapping. Although not separately depicted in FIG. 11, intermediate stage clock generator 804 also generates, in response to the first and second synchronization signals, duplicate versions of the following signals: p1_d, p2_d, p1_c, and p2_c. The timing relationships of these various signals are depicted in FIG. 3. Notably, the p1_d and p2_d signals generated by intermediate stage clock generator 804 are non-overlapping, and the p1_c and p2_c signals generated by intermediate stage clock generator 804 are non-overlapping.

In the example ADC embodiment described herein, the six output signals from intermediate stage clock generator 804 (p1, p1_d, p1_c, p2, p2_d, and p2_c) are routed to the third through seventh ADC stages. The timing relationships of these six signals are depicted in FIG. 3. For the sake of simplicity, only the main clock signal labels (p1 and p2) are shown leading to the third through seventh ADC stage. It should be understood that these labels are intended to represent the p1 family of signals and the p2 family of signals, respectively.

An embodiment of clock generator architecture 800 may utilize more than one intermediate stage clock generator in series. For example, clock generator architecture 800 may utilize up to five intermediate stage clock generators for ADC 200 (i.e., one intermediate stage clock generator for each of the third through seventh ADC stages). Such intermediate stage clock generators may be desirable in practical embodiments because as explained above, when a single clock generator circuit has to provide clocks to multiple stages, the power and area requirements can be excessive. It is therefore desirable in some instances to use additional clock generator stages to reduce these effects. Embodiments of the present invention can be configured with at least one back end clock generator and in the limit could also include a clock generator for each back end ADC stage. Typically, as shown in clock generator architecture 800, one additional clock generator is sufficient.

Second stage clock generator 806 includes a first input node 818 for a first signal that is based upon the first primary clock signal (p1), and a second input node 820 for a second signal that is based upon the second primary clock signal (p2). In this example, the duplicate first primary clock signal and the duplicate second primary clock signal (generated by intermediate stage clock generator 804) serve as the inputs to second stage clock generator 806. Notably, these inputs to second stage clock generator 806 do not include the delayed or complementary variants of the p1 and p2 signals. Second stage clock generator 806 is suitably configured to generate, in response to the p1_sync and p2_sync signals, a first clock phase signal (labeled $p1_a$) based upon the p1 primary clock signal, a second clock phase signal (labeled $p1_b$) based upon the p1 primary clock signal, a third clock phase signal (labeled p2a) based upon the p2 primary clock signal, and a fourth clock phase signal (labeled p2b) based upon the p2 primary clock signal. In this example, the p1a, p1b, p2a, and p2b signals are mutually non-overlapping. Although not separately depicted in FIG. 11, second stage clock generator 806 also generates, in response to the p1_sync and p2_sync signals: a first delayed clock phase signal ($p1_a$_d) based upon the p1 primary clock signal, a second delayed clock phase signal ($p1_b$_d) based upon the p1 primary clock signal, a third delayed clock phase signal (p2a_d) based upon the p2 primary clock signal, a fourth delayed clock phase signal (p2b_d) based upon the p2 primary clock signal, a first complementary delayed clock phase signal (p1a_c) based upon the p1 primary clock signal, a second complementary delayed clock phase signal ($p1_b$_c) based upon the p1 primary clock signal, a third complementary delayed clock phase signal (p2a_c) based upon the p2 primary clock signal, and a fourth complementary delayed clock phase signal (p2b_c) based upon the p2 primary clock signal. The timing relationships of these various signals are depicted in FIG. 4. Notably, the $p1_a$_d, $p1_b$_d, p2a_d, and p2b_d clock phase signals are mutually non-overlapping, and the p1a_c, $p1_b$_c, $p2_a$_c, and p2b_c clock phase signals are mutually non-overlapping.

In the example ADC embodiment described herein, the twelve output signals from second stage clock generator 806 (p1a, $p1_a$_d, p1a_c, p2a, p2a_d, $p2_a$_c, p1b, $p1_b$_d, $p1_b$_c, p2b, $p2_b$_d, and p2b_c) are routed to the second ADC stage, which is also referred to as the DHS stage. For the sake of simplicity, FIG. 11 only shows the main clock signal labels (p1a, p2a, p1b, and p2b) leading to the second ADC stage. It should be understood that these labels are intended to represent the p1a family of signals, the p2a family of signals, the p1b family of signals, and the p2b family of signals, respectively.

First stage clock generator 808 includes an input node 822 that is coupled to an output node 824 of second stage clock generator 806. Input node 822 receives a suitable synchronization signal from second stage clock generator 806. In this example, first stage clock generator 808 utilizes the p2 signal generated by second stage clock generator 806 as its synchronization signal (labeled p2_sync). Notably, the p2_sync input does not include the p2_d signal or the p2_c signal. First stage clock generator 808 is appropriately configured to generate non-overlapping clock signals for use by the first ADC stages. In practice, first stage clock generator 808 generates its clock signals under the control of second stage clock generator 806.

In response to the p2_sync signal and the main clock signal, first stage clock generator 808 provides a first first-stage clock signal (labeled p1__1) and a second first-stage clock signal (labeled p2__1) that is non-overlapping with the p1__1 signal. As mentioned above in connection with clock generator architecture 400, the p1__1 signal has the same characteristics as the p1 signal, and the p2__1 signal has the same characteristics as the p2 signal. Moreover, although not separately depicted in FIG. 11, first stage clock generator 808 also generates, in response to its input signals: a delayed first-stage clock signal (p1__1_d) based upon the p1__1 clock signal, a delayed first-stage clock signal (p2__1_d) based upon the p2__1 clock signal, a complementary delayed first-stage clock signal (p1__1_c) based upon the p1__1 clock signal, and a complementary delayed first-stage clock signal (p2__1_c) based upon the p2__1 clock signal. Notably, the p1__1_d and p2__1_d signals are non-overlapping, and the p1__1_c and p2__1_c signals are non-overlapping.

In the example ADC embodiment described herein, the six output signals from first stage clock generator 808 (p1__1, p1__1_d, p1__1_c, p2__1, p2__1_d, and p2__1_c) are routed to the first ADC stages. For the sake of simplicity, FIG. 11 only shows the base clock signal labels (p1__1 and p2__1) leading to the first ADC stages. It should be understood that these labels are intended to represent the p1__1 family of signals and the p2__1 family of signals, respectively.

Back end clock generator 802 may be realized as back end clock generator 500 (see FIG. 8), as the clock generator described in U.S. Pat. No. 5,818,276, or as any suitably configured non-overlapping clock signal generator.

Figure 12:
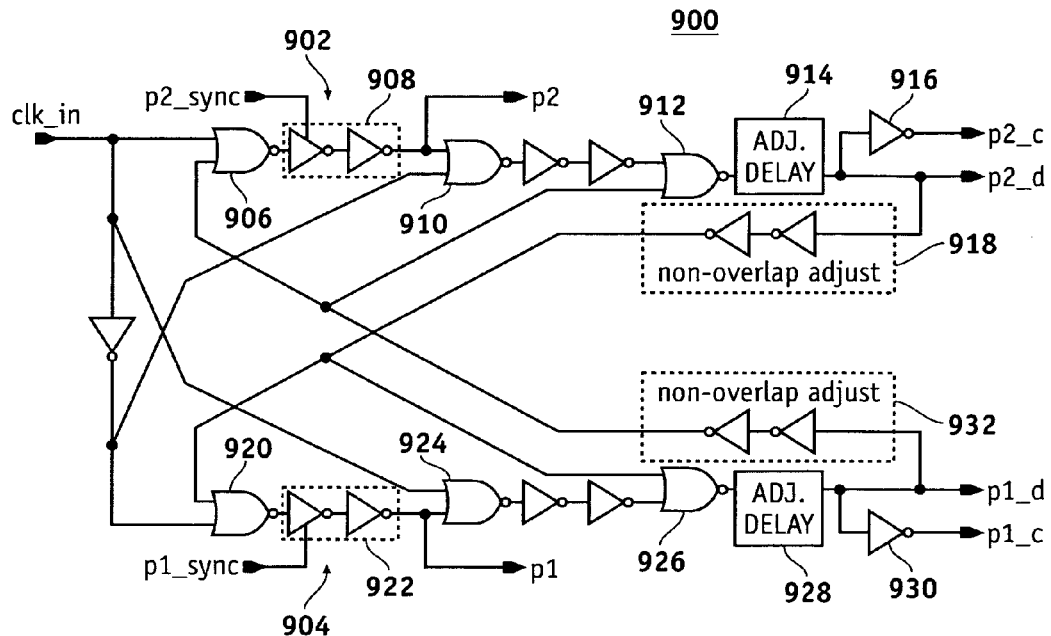
FIG. 12 is a schematic representation of an intermediate stage clock generator suitable for use in the architecture shown in FIG. 11.

FIG. 12 is a schematic representation of an intermediate stage clock generator 900 suitable for use in clock generator architecture 800. In this example, intermediate stage clock generator 900 is appropriately configured to generate the respective non-overlapping clock signals for the third through seventh stages of ADC 200. The fundamental operating characteristics of intermediate stage clock generator 900 are described in United U.S. Pat. No. 5,818,276. Notably, intermediate stage clock generator 900 is able to increase or decrease the non-overlap time (time $t_3$–$t_2$ in FIG. 3) by adjusting the propagation delay through non-overlap adjustment arrangements.

Intermediate stage clock generator 900 generally includes a first clock signal generation branch 902 coupled to a second clock signal generation branch 904. In this example, the first branch 902 includes an input NOR gate 906, a synchronizing arrangement 908, an intermediate NOR gate 910, and an output NOR gate 912. The first branch 902 may also include an adjustable delay element 914, an inverter 916, and a non-overlap adjustment arrangement 918. In this example, the second branch 904 includes an input NOR gate 920, a synchronizing arrangement 922, an intermediate NOR gate 924, and an output NOR gate 926. The second branch 904 may also include an adjustable delay element 928, an inverter 930, and a non-overlap adjustment arrangement 932.

Input NOR gate 906 has one input node configured to receive the main clock signal (clk_in), and another input node configured to receive the signal generated by non-overlap adjustment arrangement 932. The output node of NOR gate 906 is coupled to the input node of synchronizing arrangement 908. Synchronizing arrangement 908 also includes an enable input configured to receive a suitable synchronization signal, and an output node that is coupled to one input node of intermediate NOR gate 910. In this example, synchronizing arrangement 908 receives the p2_sync signal as its synchronizing signal (see FIG. 11). In practice, the p2_sync signal functions to control the timing of the first clock signal generation branch 902 by controlling when the output of NOR gate 906 is fed into the remainder of the circuit so that the remaining clock signals are not generated prematurely, thereby maintaining the timing relationships that are shown in FIG. 6. In addition, synchronizing arrangement 908 minimizes the delay from the time the p2_sync signal arrives to the time when the output of NOR gate 906 is fed to the remainder of the circuit since the output of NOR gate 906 has been previously generated based on the clk_in signal, which arrives prior to the p2_sync signal. Thus, synchronizing arrangement 908 in conjunction with intermediate stage clock generator 900 preserves the desired timing relationships while minimizing the delays between the clock signals that are used for the various stages in a pipelined ADC. As shown in FIG. 12, the output of synchronizing arrangement 908 may represent the duplicate p2 clock signal.

Intermediate NOR gate 910 has one input node coupled to the output of synchronizing arrangement 908, and another input node coupled to receive an inverted representation of the main clock signal. The output node of intermediate NOR gate 910 may be coupled (directly or via one or more pairs of inverters as shown) to an input node of NOR gate 912. Output NOR gate 912 has another input node that is coupled to receive the signal generated by non-overlap adjustment arrangement 932. Output NOR gate 912 may feed adjustable delay element 914, which is suitably configured to introduce a desired amount of overall delay (i.e., delay both the rising and falling edges) to the clock signals generated by first clock signal generation branch 902. In practice, adjustable delay element 914 may be realized as any number of inverter pairs, where the number is chosen according to the desired amount of delay. In this example, the output of adjustable delay element 914 corresponds to the p2_d signal, and inverter 916 inverts the p2_d signal to generate the p2_c signal.

Non-overlap adjustment arrangement 918 is coupled between first clock signal generation branch 902 and second clock signal generation branch 904. More specifically, non-overlap adjustment arrangement 918 has an input node coupled to receive the p2_d signal, and an output node that is coupled to NOR gate 920 and to NOR gate 926. Non-overlap adjustment arrangement 918 may have the structure and functionality of the non-overlap adjustment arrangements described above in connection with FIG. 8.

Input NOR gate 920 has one input node configured to receive an inverted representation of the main clock signal, and another input node configured to receive the signal generated by non-overlap adjustment arrangement 918. The output node of NOR gate 920 is coupled to the input node of synchronizing arrangement 922. Synchronizing arrangement 922 also includes an enable input configured to receive a suitable synchronization signal, and an output node that is coupled to one input node of intermediate NOR gate 924. In this example, synchronizing arrangement 922 receives the p1_sync signal as its synchronizing signal (see FIG. 11). In practice, the p1_sync signal functions to control the timing of second clock signal generation branch 904 by controlling when the output of NOR gate 920 is fed into the remainder of the circuit, as equivalently described above in connection with the p2_sync signal. As shown in FIG. 12, the output of synchronizing arrangement 922 may represent the duplicate p1 clock signal.

Intermediate NOR gate 924 has one input node coupled to the output of synchronizing arrangement 922, and another input node coupled to receive the main clock signal. The output node of intermediate NOR gate 924 may be coupled (directly or via one or more pairs of inverters as shown) to an input node of NOR gate 926. Output NOR gate 926 has another input node that is coupled to receive the signal generated by non-overlap adjustment arrangement 918. Output NOR gate 926 may feed adjustable delay element 928, which is suitably configured to introduce a desired amount of overall delay (i.e., delay both the rising and falling edges) to the clock signals generated by second clock signal generation branch 904. In practice, adjustable delay element 914 may be realized as any number of inverter pairs, where the number is chosen according to the desired amount of delay. In this example, the output of adjustable delay element 928 corresponds to the p1_d signal, and inverter 930 inverts the p1_d signal to generate the p1_c signal.

Non-overlap adjustment arrangement 932 is coupled between first clock signal generation branch 902 and second clock signal generation branch 904. More specifically, non-overlap adjustment arrangement 932 has an input node coupled to receive the p1_d signal, and an output node that is coupled to NOR gate 906 and to NOR gate 912. Non-overlap adjustment arrangement 932 may have the structure and functionality of the non-overlap adjustment arrangements described above in connection with FIG. 8.

Figure 13:
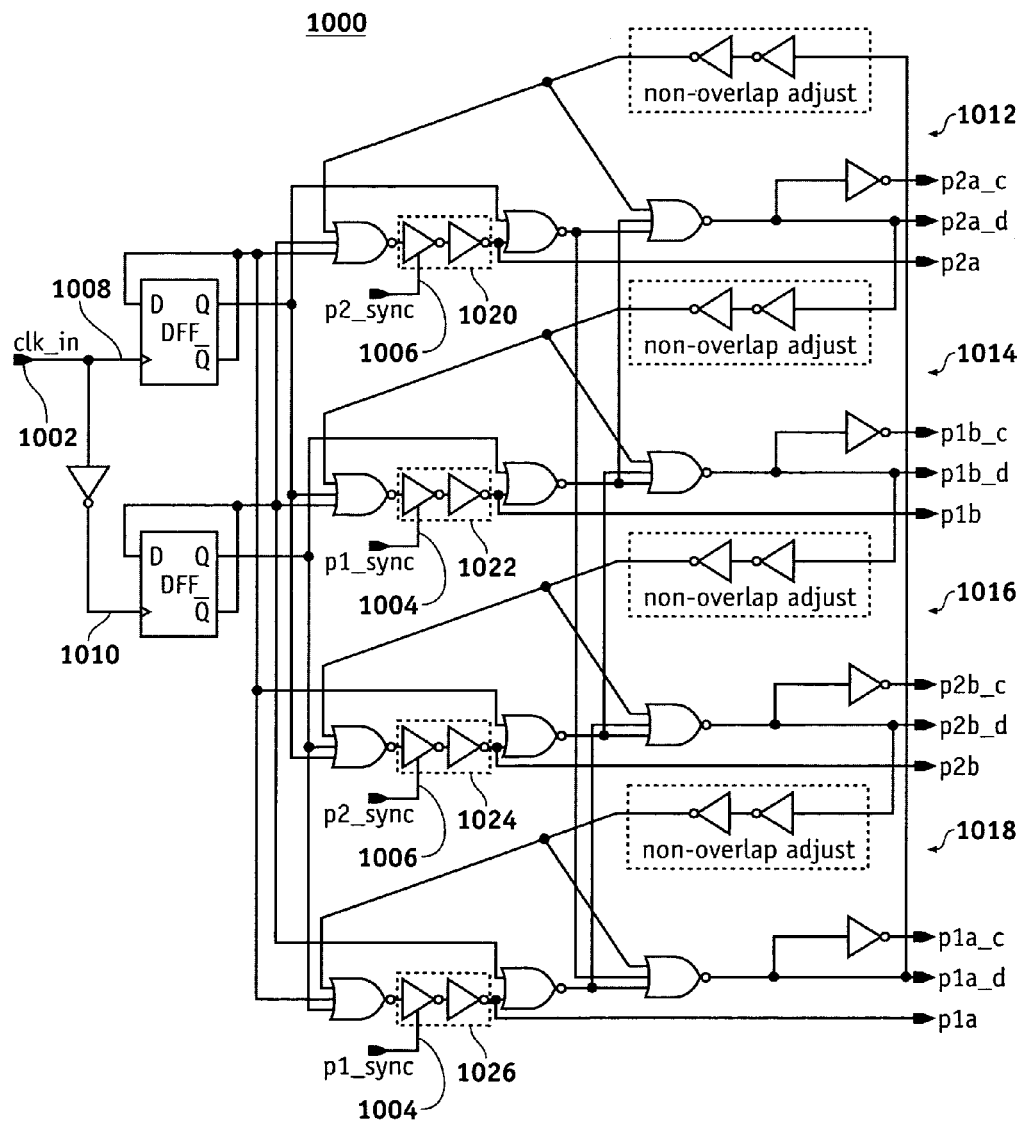
FIG. 13 is a schematic representation of a second stage clock generator suitable for use in the architecture shown in FIG. 11.

FIG. 13 is a schematic representation of a second stage clock generator 1000 suitable for use in clock generator architecture 800. Second stage clock generator 1000 is similar to second stage clock generator 600, which was described in detail above in connection with FIG. 9. Accordingly, elements, features, and functionality common to both second stage clock generators 600/1000 will not be redundantly described in the context of second stage clock generator 1000.

In this example embodiment, second stage clock generator 1000 includes an input node 1002 configured to receive the main clock signal, a first synchronization input node 1004 for a first synchronization signal (labeled p1_sync), and a second synchronization input node 1006 for a second synchronization signal (labeled p2_sync). The main clock signal may be considered to be a first clock signal 1008 for second stage clock generator 1000, while an inverted representation of the main clock signal may be considered to be a second clock signal 1010 for second stage clock generator 1000. As described above, the p1_sync and p2_sync signals may be derived from the main clock signal in the example embodiments. Moreover, the p1_sync and p2_sync signals are non-overlapping in the example embodiments.

Second stage clock generator 1000 includes four clock signal generation branches. In the illustrated embodiment, a clock signal generation branch 1012 is suitably configured to generate the p2a family of signals, a clock signal generation branch 1014 is suitably configured to generate the p1b family of signals, a clock signal generation branch 1016 is suitably configured to generate the p2b family of signals, and a clock signal generation branch 1018 is suitably configured to generate the p1a family of signals. In contrast to second stage clock generator 600, clock signal generation branch 1012 includes a synchronizing arrangement 1020 coupled between its input NOR gate and its intermediate NOR gate, clock signal generation branch 1014 includes a synchronizing arrangement 1022 coupled between its input NOR gate and its intermediate NOR gate, clock signal generation branch 1016 includes a synchronizing arrangement 1024 coupled between its input NOR gate and its intermediate NOR gate, and clock signal generation branch 1018 includes a synchronizing arrangement 1026 coupled between its input NOR gate and its intermediate NOR gate. Synchronizing arrangement 1020 includes an enable input configured to receive the p2_sync signal, and an output node for the p2a signal. Likewise, synchronizing arrangement 1022 includes an enable input configured to receive the p1_sync signal, and an output node for the p1b signal. Similarly, synchronizing arrangement 1024 includes an enable input configured to receive the p2_sync signal, and an output node for the p2b signal. Finally, synchronizing arrangement 1026 includes an enable input configured to receive the p1_sync signal, and an output node for the p1a signal. Each of these synchronizing arrangements may have the structure and functionality of the synchronizing arrangements described above in connection with FIG. 12.

Referring again to FIG. 11, second stage clock generator 806 drives first stage clock generator 808. However, other than the main clock signal, only the p2_sync signal is used as an input to first stage clock generator 808 in this example embodiment. In practice, this particular arrangement is suitable for use in pipelined ADCs that only use one stage per channel before the DHS stage. This is because both of the clock signals p1 and p2 are not used to sample the input or generate an output or residue voltage. In this example, the p1 signal is used to control the sampling of the input and it is therefore advantageous to have the p1 and p1_d signals rise simultaneously and then have the p1_d signal fall after the p1 signal, thereby maximizing the sample time. A row of NOR gates (reference numbers 1114, 1116, and 1118 in FIG. 14) are therefore included. The p2 signal, on the other hand is used to generate the stage output or residue voltage and it is therefore not as critical that the p2 and p2_d signals rise simultaneously. In practice, however, it is important to have the p2 signal synchronized with the p2 signal from the previous stage so that one or more synchronizing arrangements may be included in the clock generator architecture. In this manner, the desired clock signals can be generated correctly while a reduction in power and area can be achieved over the circuit described above in connection with FIG. 10 since fewer NOR gates and routing are utilized. In this example, only the p2_sync signal need be used because the p2 clock signal controls when the DHS stage of ADC 200 is interacting with the first stage of ADC 200. In other words, ADC 200 and, therefore, clock generator architecture 800, need not synchronize with the p1 clock signal.

Figure 14:
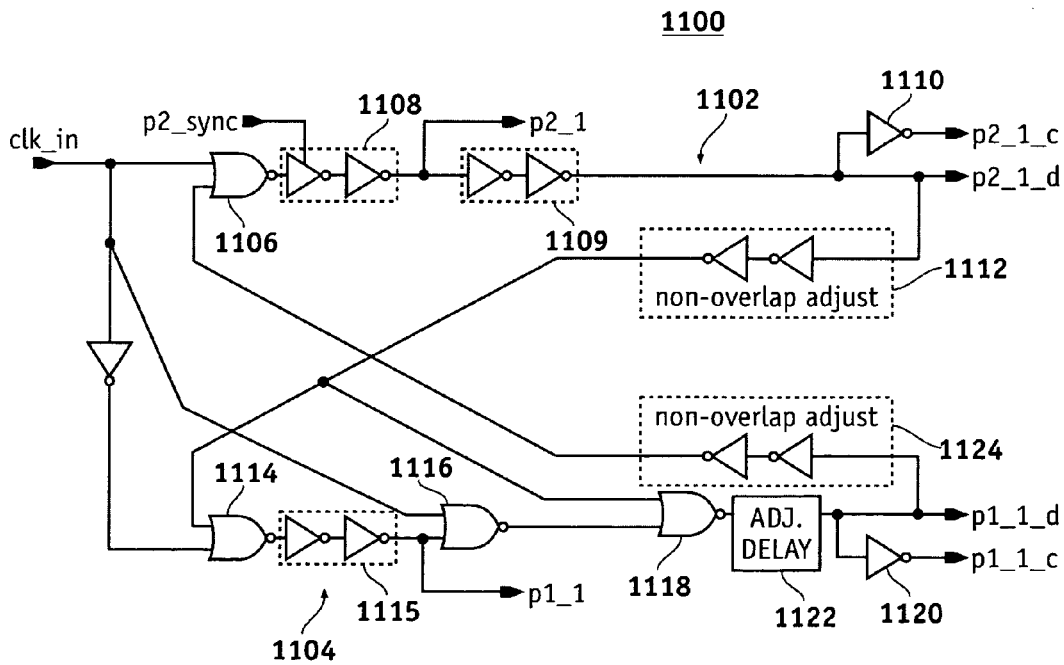
FIG. 14 is a schematic representation of a first stage clock generator suitable for use in the architecture shown in FIG. 11.

FIG. 14 is a schematic representation of a first stage clock generator 1100 suitable for use in clock generator architecture 800. In this example, first stage clock generator 1100 is appropriately configured to generate the respective non-overlapping clock signals for the first stages of ADC 200. First stage clock generator 1100 generally includes a first clock signal generation branch 1102 coupled to a second clock signal generation branch 1104. In this example, the first branch 1102 is suitably configured to generate the p2_1 family of signals, and the second branch 1104 is suitably configured to generate the p1_1 family of signals.

The first branch 1102 includes an input NOR gate 1106, a synchronizing arrangement 1108, a delay element 1109, and an inverter 1110. The first branch 1102 may also include a non-overlap adjustment arrangement 1112. In this example, the second branch 1104 includes an input NOR gate 1114, a delay element 1115, an intermediate NOR gate 1116, an output NOR gate 1118, and an inverter 1120. The second branch 1104 may also include an adjustable delay element 1122 and a non-overlap adjustment arrangement 1124.

Input NOR gate 1106 has one input node configured to receive the main clock signal (clk_in), and another input node configured to receive the signal generated by non-overlap adjustment arrangement 1124. The output node of NOR gate 1106 is coupled to the input node of synchronizing arrangement 1108. Synchronizing arrangement 1108 also includes an enable input configured to receive a suitable enable signal, and an output node that is coupled to the input of delay element 1109. In this example, synchronizing arrangement 1108 receives the p2_sync signal from second stage clock generator 806 as its enable/synchronization signal (see FIG. 11). In practice, the p2_sync signal functions to control the timing of first clock signal generation branch 1102 by controlling when the output of NOR gate 1106 is fed into the remainder of the circuit, in the manner described previously. As shown in FIG. 14, the output of synchronizing arrangement 1108 may represent one of the first-stage clock signals (e.g., the p2_1 signal).

Delay element 1109, which may be realized as any number of inverter pairs selected to provide the desired amount of delay, generates the p2_1_d signal. In practice, delay element 1109 delays both edges of p2_1 signal. Inverter 1110 inverts the p2_1_d signal to generate the p2_1_c signal. Non-overlap adjustment arrangement 1112 is coupled between the first clock signal generation branch 1102 and the second clock signal generation branch 1104. More specifically, non-overlap adjustment arrangement 1112 has an input node coupled to receive the p2_1_d signal, and an output node that is coupled to NOR gate 1114 and to NOR gate 1118. Non-overlap adjustment arrangement 1112 may have the structure and functionality of the non-overlap adjustment arrangements described above in connection with FIG. 8.

Input NOR gate 1114 has one input node configured to receive an inverted representation of the main clock signal, and another input node configured to receive the signal generated by non-overlap adjustment arrangement 1112. The output node of NOR gate 1114 is coupled to the input of delay element 1115, which may be realized as any number of inverter pairs selected to provide a desired amount of delay for the signal generated by input NOR gate 11 14. In this example, the output of delay element 1115 corresponds to the p1_1 signal. In addition, the output of delay element 1115 may be routed to an input node of intermediate NOR gate 1116. Intermediate NOR gate 1116 has another input node that is coupled to receive the main clock signal.

The output node of intermediate NOR gate 1116 may be coupled to an input node of NOR gate 1118. Output NOR gate 1118 has another input node that is coupled to receive the signal generated by non-overlap adjustment arrangement 1112. Output NOR gate 1118 may feed adjustable delay element 1122, which is suitably configured to introduce a desired amount of overall delay (i.e., delay both the rising and falling edges) to the clock signals generated by the second clock signal generation branch 1104. In practice, adjustable delay element 1122 may be realized as any number of inverter pairs, where the number is chosen according to the desired amount of delay. In this example, the output of adjustable delay element 1122 corresponds to the p1_1_d signal, and inverter 1120 inverts the p1_1_d signal to generate the p1_1_c signal.

Non-overlap adjustment arrangement 1124 is coupled between the first clock signal generation branch 1102 and the second clock signal generation branch 1104. More specifically, non-overlap adjustment arrangement 1124 has an input node coupled to receive the p1_1_d signal, and an output node that is coupled to NOR gate 1106. Non-overlap adjustment arrangement 1124 may have the structure and functionality of the non-overlap adjustment arrangements described above in connection with FIG. 8.

First stage clock generator 1100 is advantageous because it need not use both of the clock signals p1 and p2 to sample the input or generate an output or residue voltage. In this example, the p1 signal is used to control the sampling of the input and it is therefore advantageous to have the p1 and p1_d signals rise simultaneously and then have the p1_d signal fall after the p1 signal, thereby maximizing the sample time. A row of NOR gates 1114/1116/1118 are therefore included in this circuit. The p2 signal, on the other hand is only used to generate the stage output or residue voltage and it is therefore not as critical that the p2 and p2_d signals rise simultaneously. It is important, however, to have the p2 signal synchronized with the p2 signal from the previous stage. Accordingly, synchronizing arrangement 1108 is included in the upper portion of first stage clock generator 1100. In this manner, the desired clock signals can be generated correctly while a reduction in power and area can be achieved over the circuit described above in connection with FIG. 10 (since fewer NOR gates and routing are utilized).

In summary, systems, devices, and methods configured in accordance with example embodiments of the invention relate to:

A multi-stage clock generator architecture that generates multiple non-overlapping clock phases, the clock generator architecture comprising: a back end clock generator having an input for a main clock signal, the back end clock generator being configured to generate, in response to the main clock signal, a first primary clock signal and a second primary clock signal that is non-overlapping with the first primary clock signal; and a second stage clock generator coupled to the back end clock generator, the second stage clock generator having a first input for a first signal that is based upon the first primary clock signal and a second input for a second signal that is based upon the second primary clock signal, the second stage clock generator being configured to generate, in response to the first signal and the second signal, a first clock phase signal based upon the first primary clock signal, a second clock phase signal based upon the first primary clock signal, a third clock phase signal based upon the second primary clock signal, and a fourth clock phase signal based upon the second primary clock signal, the first, second, third, and fourth clock phase signals being mutually non-overlapping. The back end clock generator may be configured to generate, in response to the main clock signal, a first delayed primary clock signal, a second delayed primary clock signal that is non-overlapping with the first delayed primary clock signal, a first complementary delayed primary clock signal, and a second complementary delayed primary clock signal that is non-overlapping with the first complementary delayed primary clock signal; the second stage clock generator may be configured to generate, in response to the first signal and the second signal, a first delayed clock phase signal based upon the first primary clock signal, a second delayed clock phase signal based upon the first primary clock signal, a third delayed clock phase signal based upon the second primary clock signal, a fourth delayed clock phase signal based upon the second primary clock signal, a first complementary delayed clock phase signal based upon the first primary clock signal, a second complementary delayed clock phase signal based upon the first primary clock signal, a third complementary delayed clock phase signal based upon the second primary clock signal, and a fourth complementary delayed clock phase signal based upon the second primary clock signal; the first, second, third, and fourth delayed clock phase signals may be mutually non-overlapping; and the first, second, third, and fourth complementary delayed clock phase signals may be mutually non-overlapping. The multi-stage clock generator architecture may further comprise a first stage clock generator coupled to the second stage clock generator, the first stage clock generator being configured to generate, under the control of the second stage clock generator, a first first-stage clock signal and a second first-stage clock signal that is non-overlapping with the first first-stage clock signal. The first stage clock generator may comprise: a first OR gate configured to receive the first and second clock phase signals, the first OR gate having an output node; a second OR gate configured to receive the third and fourth clock phase signals, the second OR gate having an output node; a first NOR gate having an input node coupled to the output node of the first OR gate, and having an output node for the second first-stage clock signal; and a second NOR gate having an input node coupled to the output node of the second OR gate, and having an output node for the first first-stage clock signal. The first stage clock generator may comprise: a first NOR gate having an input node configured to receive the main clock signal, and having an output node; a synchronizing arrangement comprising an input node coupled to the output node of the first NOR gate, an enable input configured to receive an enable signal based upon the second primary clock signal, and an output node for the second first-stage clock signal; and a second NOR gate having an input node configured to receive an inverted representation of the main clock signal, the second NOR gate being configured to generate an output upon which the first first-stage clock signal is based. The multi-stage clock generator architecture may further comprise an intermediate clock generator stage having: a first synchronization input node coupled to the back end clock generator to receive the first primary clock signal as a first synchronization signal; and a second synchronization input node coupled to the back end clock generator to receive the second primary clock signal as a second synchronization signal; wherein the intermediate clock generator is configured to generate, in response to the first synchronization signal and the second synchronization signal, a duplicate first primary clock signal corresponding to the first primary clock signal, and a duplicate second primary clock signal corresponding to the second primary clock signal; and the duplicate second primary clock signal is non-overlapping with the duplicate first primary clock signal. The duplicate first primary clock signal may correspond to the first signal for the second stage clock generator; and the duplicate second primary clock signal may correspond to the second signal for the second stage clock generator. The intermediate clock generator may comprise: a first NOR gate having an input node configured to receive the main clock signal, and having an output node; a first synchronizing arrangement comprising an input node coupled to the output node of the first NOR gate, an enable input configured to receive the second synchronization signal, and an output node for the duplicate second primary clock signal; a second NOR gate having an input node configured to receive an inverted representation of the main clock signal, and having an output node; and a second synchronizing arrangement comprising an input node coupled to the output node of the second NOR gate, an enable input configured to receive the first synchronization signal, and an output node for the duplicate first primary clock signal.

A clock generator that generates multiple non-overlapping clock phases, the clock generator comprising: a first frequency divider having an input node for a first clock signal, and having an output node, the first frequency divider being configured to divide the first clock signal by two in frequency to obtain a first trigger signal at the output node of the first frequency divider; a second frequency divider having an input node for a second clock signal, and having an output node, the second frequency divider being configured to divide the second clock signal by two in frequency to obtain a second trigger signal at the output node of the second frequency divider, the second clock signal being an inverted representation of the first clock signal; a first clock signal generation branch coupled to the first and second frequency dividers, the first clock signal generation branch being configured to generate, in response to the first and second trigger signals, a first clock phase signal based upon the first clock signal; a second clock signal generation branch coupled to the first and second frequency dividers, the second clock signal generation branch being configured to generate, in response to the first and second trigger signals, a second clock phase signal based upon the first clock signal; a third clock signal generation branch coupled to the first and second frequency dividers, the third clock signal generation branch being configured to generate, in response to the first and second trigger signals, a third clock phase signal based upon the second clock signal; and a fourth clock signal generation branch coupled to the first and second frequency dividers, the fourth clock signal generation branch being configured to generate, in response to the first and second trigger signals, a fourth clock phase signal based upon the second clock signal, the first, second, third, and fourth clock phase signals being mutually non-overlapping. The first clock signal generation branch may be configured to generate, in response to the first and second trigger signals, a first delayed clock phase signal based upon the first clock phase signal, and a first complementary delayed clock phase signal based upon the first delayed clock phase signal; the second clock signal generation branch may be configured to generate, in response to the first and second trigger signals, a second delayed clock phase signal based upon the second clock phase signal, and a second complementary delayed clock phase signal based upon the second delayed clock phase signal; the third clock signal generation branch may be configured to generate, in response to the first and second trigger signals, a third delayed clock phase signal based upon the third clock phase signal, and a third complementary delayed clock phase signal based upon the third delayed clock phase signal; the fourth clock signal generation branch may be configured to generate, in response to the first and second trigger signals, a fourth delayed clock phase signal based upon the fourth clock phase signal, and a fourth complementary delayed clock phase signal based upon the fourth delayed clock phase signal; the first, second, third, and fourth delayed clock phase signals may be mutually non-overlapping; and the first, second, third, and fourth complementary delayed clock phase signals may be mutually non-overlapping. The clock generator may further comprise: a first non-overlap adjustment arrangement coupled between the first and third clock signal generation branches; a second non-overlap adjustment arrangement coupled between the second and third clock signal generation branches; a third non-overlap adjustment arrangement coupled between the second and fourth clock signal generation branches; and a fourth non-overlap adjustment arrangement coupled between the first and fourth clock signal generation branches. The clock generator may further comprise: an input node for a main clock signal, the first and second clock signals being derived from the main clock signal; a first synchronization input node for a first synchronization signal derived from the main clock signal; a second synchronization input node for a second synchronization signal derived from the main clock signal, wherein the second synchronization signal is non-overlapping with the first synchronization signal; a first synchroniz-ing arrangement within the first clock signal generation branch, the first synchronizing arrangement comprising an enable input configured to receive the first synchronization signal, and an output node for the first clock phase signal; a second synchronizing arrangement within the second clock signal generation branch, the second synchronization arrangement comprising an enable input configured to receive the first synchronization signal, and an output node for the second clock phase signal; a third synchronizing arrangement within the third clock signal generation branch, the third synchronizing arrangement comprising an enable input configured to receive the second synchronization signal, and an output node for the third clock phase signal; and a fourth synchronizing arrangement within the fourth clock signal generation branch, the fourth synchronizing arrangement comprising an enable input configured to receive the second synchronization signal, and an output node for the fourth clock phase signal.

A multi-stage clock generator architecture that generates multiple non-overlapping clock phases, the clock generator architecture comprising: a back end clock generator having an input for a main clock signal, the back end clock generator being configured to generate, in response to the main clock signal, a first primary clock signal and a second primary clock signal that is non-overlapping with the first primary clock signal; and a second stage clock generator coupled to the back end clock generator, and operable in response to the first and second primary clock signals, the second stage clock generator comprising: a first frequency divider having an input node for a first clock signal derived from the main clock signal, and having an output node, the first frequency divider being configured to divide the first clock signal by two in frequency to obtain a first trigger signal at the output node of the first frequency divider; a second frequency divider having an input node for a second clock signal derived from the main clock signal, and having an output node, the second frequency divider being configured to divide the second clock signal by two in frequency to obtain a second trigger signal at the output node of the second frequency divider, the second clock signal being an inverted representation of the first clock signal; and a plurality of clock signal generation branches coupled to the first and second frequency dividers, each of the plurality of clock signal generation branches being configured to generate, in response to the first and second trigger signals, a different non-overlapping clock phase signal based upon the first clock signal or the second clock signal. Each of the plurality of clock signal generation branches may be configured to generate, in response to the first and second trigger signals, a respective delayed clock phase signal and a respective complementary delayed clock phase signal; all of the delayed clock phase signals can be mutually non-overlapping; and all of the complementary delayed clock phase signals can be mutually non-overlapping. The second stage clock generator may further comprise: an input node for the main clock signal; a first synchronization input node for a first synchronization signal derived from the first primary clock signal; and a second synchronization input node for a second synchronization signal derived from the second primary clock signal, wherein the second synchronization signal is non-overlapping with the first synchronization signal; wherein each of the plurality of clock signal generation branches includes a respective synchronizing arrangement comprising an enable input configured to receive the first or second synchronization signal, and an output node for its respective non-overlapping clock phase signal. The back end clock generator may be configured to generate, in response to the main clock signal, a first delayed primary clock signal, a second delayed primary clock signal that is non-overlapping with the first delayed primary clock signal, a first complementary delayed primary clock signal, and a second complementary delayed primary clock signal that is non-overlapping with the first complementary delayed primary clock signal. The multi-stage clock generator architecture may further comprise a first stage clock generator coupled to the second stage clock generator, the first stage clock generator being configured to generate, under the control of the second stage clock generator, a first first-stage clock signal and a second first-stage clock signal that is non-overlapping with the first first-stage clock signal. The multi-stage clock generator architecture may further comprise an intermediate clock generator stage having: a first synchronization input node coupled to the back end clock generator to receive the first primary clock signal as a first synchronization signal; a second synchronization input node coupled to the back end clock generator to receive the second primary clock signal as a second synchronization signal; wherein the intermediate clock generator is configured to generate, in response to the first synchronization signal and the second synchronization signal, a duplicate first primary clock signal corresponding to the first primary clock signal, and a duplicate second primary clock signal corresponding to the second primary clock signal; and the duplicate second primary clock signal is non-overlapping with the duplicate first primary clock signal. The duplicate first primary clock signal may correspond to a duplicate first synchronization signal for the second stage clock generator; and the duplicate second primary clock signal may correspond to a duplicate second synchronization signal for the second stage clock generator.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A multi-stage clock generator architecture that generates multiple non-overlapping clock phases, the clock generator architecture comprising:
   a back end clock generator having an input for a main clock signal, the back end clock generator being configured to generate, based on the main clock signal, a first primary clock signal and a second primary clock signal that is non-overlapping with the first primary clock signal, wherein the first primary clock signal and the second primary clock signal are periodic signals generated at a same frequency so that each pulse of the second primary clock signal has a rising edge and a falling edge that occur between and at different times from a falling edge of a pulse of the first primary clock signal and a rising edge of a next pulse of the first primary clock signal; and
   a second stage clock generator coupled to the back end clock generator, the second stage clock generator having a first input for a first signal that is based upon the first primary clock signal and a second input for a second signal that is based upon the second primary clock signal, the second stage clock generator being configured to generate, in response to the first signal and the second signal, a first clock phase signal based upon the first primary clock signal, a second clock phase signal based upon the first primary clock signal, a third clock phase signal based upon the second primary clock signal, and a fourth clock phase signal based upon the second primary clock signal, the first, second, third, and fourth clock phase signals being mutually non-overlapping.

2. A multi-stage clock generator architecture according to claim 1, wherein:
   the back end clock generator is configured to generate, in response to the main clock signal, a first delayed primary clock signal, a second delayed primary clock signal that is non-overlapping with the first delayed primary clock signal, a first complementary delayed primary clock signal, and a second complementary delayed primary clock signal that is non-overlapping with the first complementary delayed primary clock signal;
   the second stage clock generator is configured to generate, in response to the first signal and the second signal, a first delayed clock phase signal based upon the first primary clock signal, a second delayed clock phase signal based upon the first primary clock signal, a third delayed clock phase signal based upon the second primary clock signal, a fourth delayed clock phase signal based upon the second primary clock signal, a first complementary delayed clock phase signal based upon the first primary clock signal, a second complementary delayed clock phase signal based upon the first primary clock signal, a third complementary delayed clock phase signal based upon the second primary clock signal, and a fourth complementary delayed clock phase signal based upon the second primary clock signal;
   the first, second, third, and fourth delayed clock phase signals are mutually non-overlapping; and
   the first, second, third, and fourth complementary delayed clock phase signals are mutually non-overlapping.

3. A multi-stage clock generator architecture according to claim 1, further comprising a first stage clock generator coupled to the second stage clock generator, the first stage clock generator being configured to generate, under the control of the second stage clock generator, a first first-stage clock signal and a second first-stage clock signal that is non-overlapping with the first first-stage clock signal.

4. A multi-stage clock generator architecture according to claim 3, the first stage clock generator comprising:
   a first OR gate configured to receive the first and second clock phase signals, the first OR gate having an output node;
   a second OR gate configured to receive the third and fourth clock phase signals, the second OR gate having an output node;
   a first NOR gate having an input node coupled to the output node of the first OR gate, and having an output node for the second first-stage clock signal; and
   a second NOR gate having an input node coupled to the output node of the second OR gate, and having an output node for the first first-stage clock signal.

5. A multi-stage clock generator architecture according to claim 3, the first stage clock generator comprising:
   a first NOR gate having an input node configured to receive the main clock signal, and having an output node;
   a synchronizing arrangement comprising an input node coupled to the output node of the first NOR gate, an enable input configured to receive an enable signal based upon the second primary clock signal, and an output node for the second first-stage clock signal; and a second NOR gate having an input node configured to receive an inverted representation of the main clock signal, the second NOR gate being configured to generate an output upon which the first first-stage clock signal is based.

6. A multi-stage clock generator architecture that generates multiple non-overlapping clock phases, the clock generator architecture comprising:
- a back end clock generator having an input for a main clock signal, the back end clock generator being configured to generate, in response to the main clock signal, a first primary clock signal and a second primary clock signal that is non-overlapping with the first primary clock signal;
- a second stage clock generator coupled to the back end clock generator, the second stage clock generator having a first input for a first signal that is based upon the first primary clock signal and a second input for a second signal that is based upon the second primary clock signal, the second stage clock generator being configured to generate, in response to the first signal and the second signal, a first clock phase signal based upon the first primary clock signal, a second clock phase signal based upon the first primary clock signal, a third clock phase signal based upon the second primary clock signal, and a fourth clock phase signal based upon the second primary clock signal, the first, second, third, and fourth clock phase signals being mutually non-overlapping; and
- an intermediate clock generator stage having:
- a first synchronization input node coupled to the back end clock generator to receive the first primary clock signal as a first synchronization signal;
- a second synchronization input node coupled to the back end clock generator to receive the second primary clock signal as a second synchronization signal; wherein
- the intermediate clock generator is configured to generate, in response to the first synchronization signal and the second synchronization signal, a duplicate first primary clock signal corresponding to the first primary clock signal, and a duplicate second primary clock signal corresponding to the second primary clock signal; and
- the duplicate second primary clock signal is non-overlapping with the duplicate first primary clock signal.

7. A multi-stage clock generator architecture according to claim 6, wherein:
- the duplicate first primary clock signal corresponds to the first signal for the second stage clock generator; and
- the duplicate second primary clock signal corresponds to the second signal for the second stage clock generator.

8. A multi-stage clock generator architecture according to claim 6, the intermediate clock generator comprising:
- a first NOR gate having an input node configured to receive the main clock signal, and having an output node;
- a first synchronizing arrangement comprising an input node coupled to the output node of the first NOR gate, an enable input configured to receive the second synchronization signal, and an output node for the duplicate second primary clock signal;
- a second NOR gate having an input node configured to receive an inverted representation of the main clock signal, and having an output node; and
- a second synchronizing arrangement comprising an input node coupled to the output node of the second NOR gate, an enable input configured to receive the first synchronization signal, and an output node for the duplicate first primary clock signal.

9. A clock generator that generates multiple non-overlapping clock phases, the clock generator comprising:
- a first frequency divider having an input node for a first clock signal, and having an output node, the first frequency divider being configured to divide the first clock signal by two in frequency to obtain a first trigger signal at the output node of the first frequency divider;
- a second frequency divider having an input node for a second clock signal, and having an output node, the second frequency divider being configured to divide the second clock signal by two in frequency to obtain a second trigger signal at the output node of the second frequency divider, the second clock signal being an inverted representation of the first clock signal;
- a first clock signal generation branch coupled to the first and second frequency dividers, the first clock signal generation branch being configured to generate, in response to the first and second trigger signals, a first clock phase signal based upon the first clock signal;
- a second clock signal generation branch coupled to the first and second frequency dividers, the second clock signal generation branch being configured to generate, in response to the first and second trigger signals, a second clock phase signal based upon the first clock signal;
- a third clock signal generation branch coupled to the first and second frequency dividers, the third clock signal generation branch being configured to generate, in response to the first and second trigger signals, a third clock phase signal based upon the second clock signal; and
- a fourth clock signal generation branch coupled to the first and second frequency dividers, the fourth clock signal generation branch being configured to generate, in response to the first and second trigger signals, a fourth clock phase signal based upon the second clock signal, the first, second, third, and fourth clock phase signals being mutually non-overlapping, wherein:
- the first clock signal generation branch is configured to generate, in response to the first and second trigger signals, a first delayed clock phase signal based upon the first clock phase signal, and a first complementary delayed clock phase signal based upon the first delayed clock phase signal;
- the second clock signal generation branch is configured to generate, in response to the first and second trigger signals, a second delayed clock phase signal based upon the second clock phase signal, and a second complementary delayed clock phase signal based upon the second delayed clock phase signal;
- the third clock signal generation branch is configured to generate, in response to the first and second trigger signals, a third delayed clock phase signal based upon the third clock phase signal, and a third complementary delayed clock phase signal based upon the third delayed clock phase signal;
- the fourth clock signal generation branch is configured to generate, in response to the first and second trigger signals, a fourth delayed clock phase signal based upon the fourth clock phase signal, and a fourth complementary delayed clock phase signal based upon the fourth delayed clock phase signal;
- the first, second, third, and fourth delayed clock phase signals are mutually non-overlapping; and
- the first, second, third, and fourth complementary delayed clock phase signals are mutually non-overlapping.

10. A clock generator according to claim 9, further comprising:

a first non-overlap adjustment arrangement coupled between the first and third clock signal generation branches;

a second non-overlap adjustment arrangement coupled between the second and third clock signal generation branches;

a third non-overlap adjustment arrangement coupled between the second and fourth clock signal generation branches; and a fourth non-overlap adjustment arrangement coupled between the first and fourth clock signal generation branches.

11. A clock generator according to claim 9, further comprising:

an input node for a main clock signal, the first and second clock signals being derived from the main clock signal;

a first synchronization input node for a first synchronization signal derived from the main clock signal;

a second synchronization input node for a second synchronization signal derived from the main clock signal, wherein the second synchronization signal is non-overlapping with the first synchronization signal;

a first synchronizing arrangement within the first clock signal generation branch, the first synchronizing arrangement comprising an enable input configured to receive the first synchronization signal, and an output node for the first clock phase signal;

a second synchronizing arrangement within the second clock signal generation branch, the second synchronization arrangement comprising an enable input configured to receive the first synchronization signal, and an output node for the second clock phase signal;

a third synchronizing arrangement within the third clock signal generation branch, the third synchronizing arrangement comprising an enable input configured to receive the second synchronization signal, and an output node for the third clock phase signal; and a fourth synchronizing arrangement within the fourth clock signal generation branch, the fourth synchronizing arrangement comprising an enable input configured to receive the second synchronization signal, and an output node for the fourth clock phase signal.

12. A multi-stage clock generator architecture that generates multiple non-overlapping clock phases, the clock generator architecture comprising:

a back end clock-generator having an input for a main clock signal, the back end clock generator being configured to generate, based on the main clock signal, a first primary clock signal and a second primary clock signal that is non-overlapping with the first primary clock signal, wherein the first primary clock signal and the second primary clock signal are periodic signals generated at a same frequency so that each pulse of the second primary clock signal has a rising edge and a falling edge that occur between and at different times from a falling edge of a pulse of the first primary clock signal and a rising edge of a next pulse of the first primary clock signal; and a second stage clock generator coupled to the back end clock generator, and operable in response to the first and second primary clock signals, the second stage clock generator comprising:

a first frequency divider having an input node for a first clock signal derived from the main clock signal, and having an output node, the first frequency divider being configured to divide the first clock signal by two in frequency to obtain a first trigger signal at the output node of the first frequency divider;

a second frequency divider having an input node for a second clock signal derived from the main clock signal, and having an output node, the second frequency divider being configured to divide the second clock signal by two in frequency to obtain a second trigger signal at the output node of the second frequency divider, the second clock signal being an inverted representation of the first clock signal; and a plurality of clock signal generation branches coupled to the first and second frequency dividers, each of the plurality of clock signal generation branches being configured to generate, in response to the first and second trigger signals, a different non-overlapping clock phase signal based upon the first clock signal or the second clock signal.

13. A multi-stage clock generator architecture that generates multiple non-overlapping clock phases, the clock generator architecture comprising:

a back end clock generator having an input for a main clock signal, the back end clock generator being configured to generate, in response to the main clock signal, a first primary clock signal and a second primary clock signal that is non-overlapping with the first primary clock signal; and a second stage clock generator coupled to the back end clock generator, and operable in response to the first and second primary clock signals, the second stage clock generator comprising:

a first frequency divider having an input node for a first clock signal derived from the main clock signal, and having an output node, the first frequency divider being configured to divide the first clock signal by two in frequency to obtain a first trigger signal at the output node of the first frequency divider;

a second frequency divider having an input node for a second clock signal derived from the main clock signal, and having an output node, the second frequency divider being configured to divide the second clock signal by two in frequency to obtain a second trigger signal at the output node of the second frequency divider, the second clock signal being an inverted representation of the first clock signal; and a plurality of clock signal generation branches coupled to the first and second frequency dividers, each of the plurality of clock signal generation branches being configured to generate, in response to the first and second trigger signals, a different non-overlapping clock phase signal based upon the first clock signal or the second clock signal, wherein each of the plurality of clock signal generation branches is configured to generate, in response to the first and second trigger signals, a respective delayed clock phase signal and a respective complementary delayed clock phase signal;

all of the delayed clock phase signals are mutually non-overlapping; and all of the complementary delayed clock phase signals are mutually non-overlapping.

14. A multi-stage clock generator architecture according to claim 12, the second stage clock generator further comprising:

an input node for the main clock signal;

a first synchronization input node for a first synchronization signal derived from the first primary clock signal; and a second synchronization input node for a second synchronization signal derived from the second primary clock signal, wherein the second synchronization signal is non-overlapping with the first synchronization signal; wherein each of the plurality of clock signal generation branches includes a respective synchronizing arrangement comprising an enable input configured to receive the first or second synchronization signal, and an output node for its respective non-overlapping clock phase signal.

15. A multi-stage clock generator architecture according to claim 12, wherein the back end clock generator is configured to generate, in response to the main clock signal, a first delayed primary clock signal, a second delayed primary clock signal that is non-overlapping with the first delayed primary clock signal, a first complementary delayed primary clock signal, and a second complementary delayed primary clock signal that is non-overlapping with the first complementary delayed primary clock signal.

16. A multi-stage clock generator architecture according to claim 12, further comprising a first stage clock generator coupled to the second stage clock generator, the first stage clock generator being configured to generate, under the control of the second stage clock generator, a first first-stage clock signal and a second first-stage clock signal that is non-overlapping with the first first-stage clock signal.

17. A multi-stage clock generator architecture that generates multiple non-overlapping clock phases, the clock generator architecture comprising:

a back end clock generator having an input for a main clock signal, the back end clock generator being configured to generate, based on the main clock signal, a first primary clock signal and a second primary clock signal that is non-overlapping with the first primary clock signal;

a second stage clock generator coupled to the back end clock generator, and operable in response to the first and second primary clock signals, the second stage clock generator comprising:

a first frequency divider having an input node for a first clock signal derived from the main clock signal, and having an output node, the first frequency divider being configured to divide the first clock signal by two in frequency to obtain a first trigger signal at the output node of the first frequency divider;

a second frequency divider having an input node for a second clock signal derived from the main clock signal, and having an output node, the second frequency divider being configured to divide the second clock signal by two in frequency to obtain a second trigger signal at the output node of the second frequency divider, the second clock signal being an inverted representation of the first clock signal; and a plurality of clock signal generation branches coupled to the first and second frequency dividers, each of the plurality of clock signal generation branches being configured to generate, in response to the first and second trigger signals, a different non-overlapping clock phase signal based upon the first clock signal or the second clock signal; and an intermediate clock generator stage having:

a first synchronization input node coupled to the back end clock generator to receive the first primary clock signal as a first synchronization signal;

a second synchronization input node coupled to the back end clock generator to receive the second primary clock signal as a second synchronization signal; wherein the intermediate clock generator is configured to generate, in response to the first synchronization signal and the second synchronization signal, a duplicate first primary clock signal corresponding to the first primary clock signal, and a duplicate second primary clock signal corresponding to the second primary clock signal; and the duplicate second primary clock signal is non-overlapping with the duplicate first primary clock signal.

18. A multi-stage clock generator architecture according to claim 17, wherein:

the duplicate first primary clock signal corresponds to a duplicate first synchronization signal for the second stage clock generator; and the duplicate second primary clock signal corresponds to a duplicate second synchronization signal for the second stage clock generator.

* * * * *

UNITED STATES PATENT AND TRADEMARK OFFICE
CERTIFICATE OF CORRECTION

PATENT NO. : 7,649,957 B2
APPLICATION NO. : 11/387466
DATED : January 19, 2010
INVENTOR(S) : Garrity et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 972 days.

Signed and Sealed this

Twenty-third Day of November, 2010

David J. Kappos
*Director of the United States Patent and Trademark Office*